United States Patent
Chuang et al.

(10) Patent No.: US 12,525,485 B2
(45) Date of Patent: Jan. 13, 2026

(54) GATE CONTACT STRUCTURE

(71) Applicant: Taiwan Semiconductor Manufacturing Company, Ltd., Hsinchu (TW)

(72) Inventors: Cheng-Chi Chuang, New Taipei (TW); Huan-Chieh Su, Changhua County (TW); Sheng-Tsung Wang, Hsinchu (TW); Lin-Yu Huang, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 268 days.

(21) Appl. No.: 17/308,210

(22) Filed: May 5, 2021

(65) Prior Publication Data
US 2022/0238373 A1   Jul. 28, 2022

Related U.S. Application Data

(60) Provisional application No. 63/142,376, filed on Jan. 27, 2021.

(51) Int. Cl.
| H01L 21/768 | (2006.01) |
| H01L 21/3213 | (2006.01) |
| H01L 23/522 | (2006.01) |
| H01L 23/532 | (2006.01) |

(52) U.S. Cl.
CPC .. *H01L 21/76877* (2013.01); *H01L 21/32135* (2013.01); *H01L 21/76846* (2013.01); *H01L 21/76847* (2013.01); *H01L 23/5226* (2013.01); *H01L 23/53214* (2013.01); *H01L 23/53223* (2013.01); *H01L 23/53228* (2013.01); *H01L 23/53238* (2013.01); *H01L 23/53257* (2013.01); *H01L 23/53266* (2013.01)

(58) Field of Classification Search
CPC ......... H01L 29/66545; H01L 21/76897; H01L 29/66795; H01L 29/0847; H01L 29/785; H10B 41/35; H10B 41/30; H10B 69/00; H10B 10/12; H10B 41/40
See application file for complete search history.

(56) References Cited

U.S. PATENT DOCUMENTS

| 9,520,362 | B2 | 12/2016 | Lin et al. |
| 9,613,856 | B1 | 4/2017 | Yang et al. |
| 9,716,032 | B2 | 7/2017 | Tang et al. |
| 9,972,529 | B2 | 5/2018 | Yang et al. |
| 10,163,691 | B2 | 12/2018 | Shih et al. |

(Continued)

FOREIGN PATENT DOCUMENTS

| DE | 102017103464 A1 | 2/2018 |
| DE | 102020104975 A1 | 8/2021 |

(Continued)

*Primary Examiner* — Tony Tran
(74) *Attorney, Agent, or Firm* — HAYNES AND BOONE, LLP

(57) ABSTRACT

Semiconductor structures and methods of forming the same are provided. In one embodiment, a semiconductor structure includes an active region over a substrate, a gate structure disposed over the active region, and a gate contact that includes a lower portion disposed over the gate structure and an upper portion disposed over the lower portion.

20 Claims, 21 Drawing Sheets

(56) References Cited

U.S. PATENT DOCUMENTS

| | | | |
|---|---|---|---|
| 10,170,322 B1* | 1/2019 | Cheng | H01L 21/76826 |
| 2015/0270176 A1* | 9/2015 | Xie | H01L 21/76895 |
| | | | 438/631 |
| 2017/0338148 A1 | 11/2017 | Shusterman et al. | |
| 2018/0286957 A1 | 10/2018 | Bae et al. | |
| 2019/0067436 A1 | 2/2019 | Wu et al. | |
| 2019/0096677 A1* | 3/2019 | Xie | H01L 21/76897 |
| 2019/0164813 A1 | 5/2019 | Wang et al. | |
| 2019/0267284 A1* | 8/2019 | Lee | H01L 23/53266 |
| 2020/0126857 A1 | 4/2020 | Tsai et al. | |
| 2020/0286783 A1 | 9/2020 | Tseng et al. | |
| 2020/0365698 A1 | 11/2020 | Tsai | |

FOREIGN PATENT DOCUMENTS

| | | |
|---|---|---|
| KR | 20180073223 A | 7/2018 |
| KR | 20180103397 A | 9/2018 |

\* cited by examiner

GATE CONTACT STRUCTURE

PRIORITY DATA

The present application claims the benefit of U.S. Provisional Application No. 63/142,376, entitled "Gate Contact Structure," filed Jan. 27, 2021, the entirety of which is herein incorporated by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As scaling down of IC devices continues, dimensions of contact features, such as gate contacts and source/drain contact vias, are becoming ever smaller. While advanced lithography techniques allow formation of high-aspect-ratio openings, filling of conductive materials in the high-aspect-ratio openings has proven challenging. Unsatisfactory metal fill in the contact via or contact openings may increase resistance. While existing methods for forming contacts/contact vias are adequate for their intended purposes, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
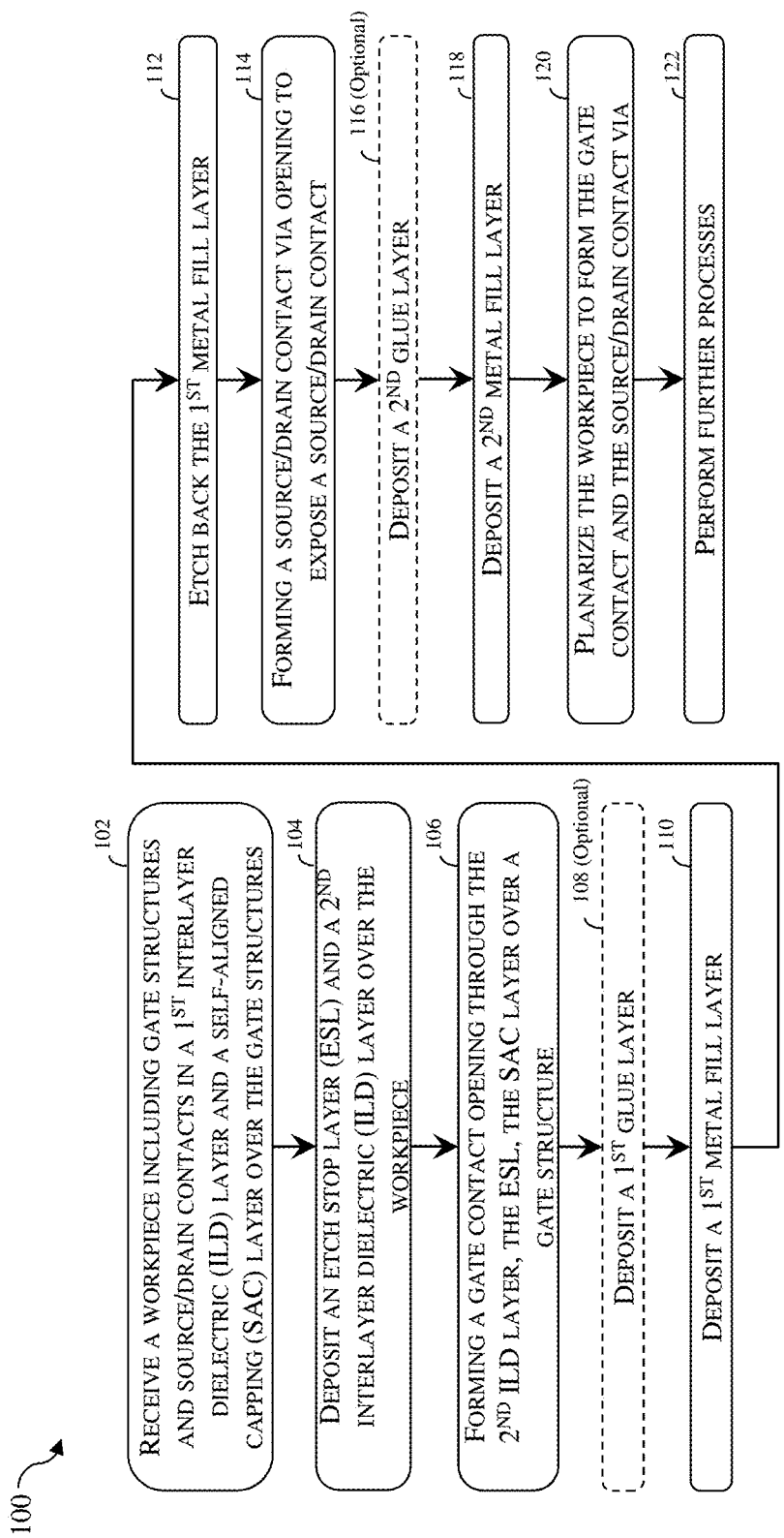
FIG. 1 is a flowchart of a method forming a contact structure in a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-type field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Interconnection of smaller multi-gate transistors calls for smaller dimensions of contact features, such as gate contacts (VGs) and source/drain contact vias (VDs). While advanced lithography techniques make possible formation of high-aspect-ratio openings, filling of conductive materials in the high-aspect-ratio openings has proven challenging. Because source/drain contacts reduce the height of source/drain contact vias, gate contact openings tend to have higher aspect ratio. In some example processes where a metal fill layer is deposited into a gate contact opening in a single-stage process, voids or gaps may be present in the already smaller gate contact. Such voids or gaps may increase the contact resistance significantly, leading to device failures or diminished performance.

The present disclosure provides a multi-stage metal fill process where a first metal fill layer is deposited and etched back before a second metal fill layer is deposited over the etched-back first metal fill layer. The multi-stage metal fill process of the present disclosure fills contact openings or contact via openings in multiple stages and the metal fill at each stage faces a smaller aspect ratio. By breaking down a single-stage high-aspect-ratio metal filling into multi-stage lower-aspect-ratio metal filling steps, methods of the present disclosure allow satisfactory metal fill into high-aspect-ratio openings. In some embodiments, more than two metal fill layers may be implemented. When a local interconnect coupling a gate structure and an adjacent source/drain feature is needed, the multi-stage metal fill process of the present disclosure may be used to form a gate contact that spans over the gate structure and the adjacent source/drain feature.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-21, which are fragmentary cross-sectional views of workpiece 200 at different stages of fabrication according to embodiments of the method 100 in FIG. 1. Because the workpiece 200 will be fabricated into a semiconductor structure, the workpiece 200 may be referred to herein as a semiconductor structure 200 as the context requires. Throughout the present disclosure, like reference numerals denote like features, unless otherwise expressly excepted. For avoidance, the X, Y and Z directions in FIGS. 2-21 are perpendicular to one another.

Figure 2:
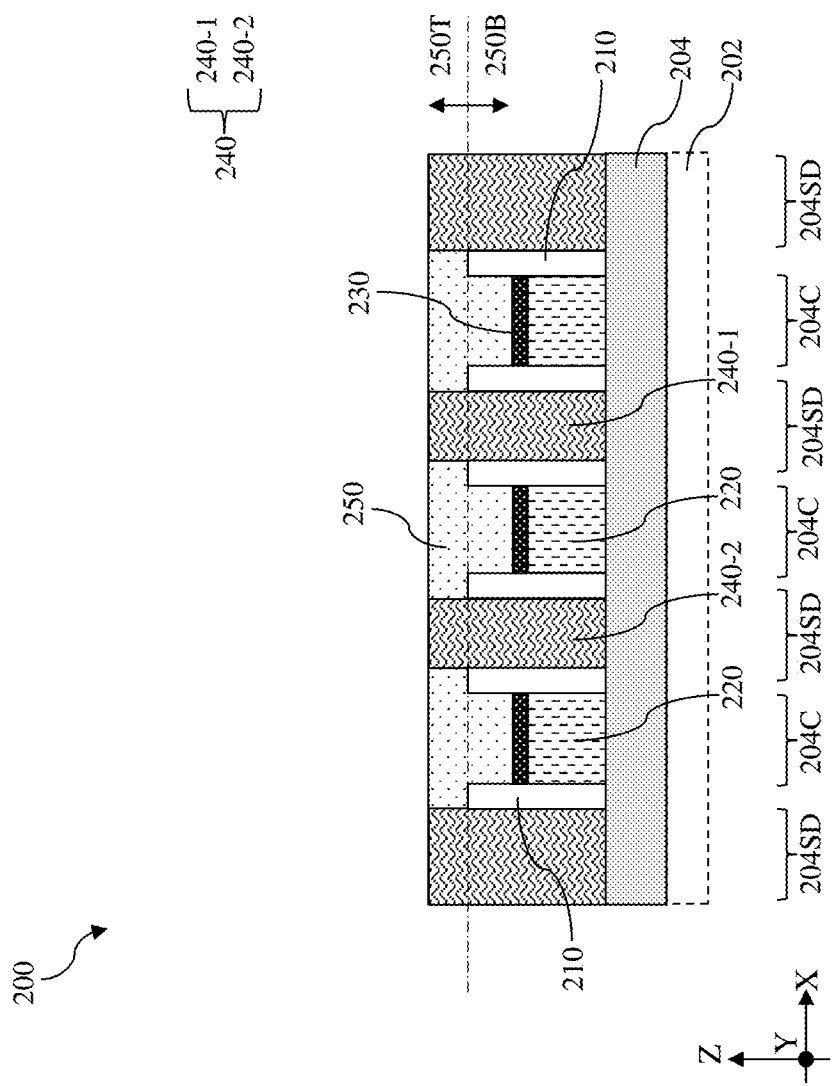
FIGS. 2-21 are fragmentary cross-sectional views of a workpiece at various stages of fabrication according to the method in FIG. 1, according to one or more aspects of the present disclosure.

Referring to FIGS. 1 and 2, method 100 includes a block 102 where a workpiece 200 is received. As shown in FIG. 2, the workpiece 200 includes an active region 204 disposed over a substrate 202. The active region 204 is a semiconductor element of a multi-gate transistor. For example, the active region 204 may be a semiconductor fin of a FinFET or a vertical stack of channel members of an MBC transistor. Depending on the shapes, the channel members of an MBC transistor may come in the form of different nanostructures, such as nanowires, nanosheets, or nanorods. The active region 204 may include a plurality of channel regions 204C and a plurality of source/drain regions 204SD. As their names suggest, the channel regions 204C are for formation of channels of multi-gate transistors and the source/drain regions 204SD are for formation of source/drain features of multi-gate transistors. The workpiece 200 also include gate structures 220 disposed over the channel regions 204C and source/drain contacts 240 disposed over the source/drain regions 204SD. Each of the gate structures 220 is lined by gate spacers 210 such that the gate structures 220 are spaced apart from the source/drain contacts 240 by the gate spacers 210. As shown in FIG. 2, the workpiece 200 further includes a selectivity metal layer 230 disposed on each of the gate structures 220. A self-aligned capping (SAC) layer 250 is disposed on each of the selectivity metal layer 230.

The substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), be strained for performance enhancement, may include a silicon-on-insulator (SOI) structure, and/or may have other suitable enhancement features. For ease of illustration, the substrate 202 is shown in dotted lines in FIG. 2 and is omitted from FIGS. 3-21.

The active region 204 may include silicon (Si) or another elementary semiconductor, such as germanium (Ge); a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. As shown in FIG. 2, the active region 204 extend lengthwise along the X direction. The active region 204 may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. The masking element may then be used to protect regions of the substrate 202 while an etch process forms recesses into the substrate 202, thereby forming the active region 204. The recesses may be etched using a dry etch (e.g., chemical oxide removal), a wet etch, and/or other suitable processes. Numerous other embodiments of methods to form the active region 204 on the substrate 202 may also be used. In embodiments where the active region 204 includes channel members of an MBC transistor, first semiconductor layers and second semiconductor layers are first alternatingly and epitaxially grown on the substrate 202 to form a layer stack. The first semiconductor layer and the second semiconductor layer have different compositions. For example, the first semiconductor layer may include silicon (Si) and the second semiconductor layer may include silicon germanium (SiGe). The semiconductor layer stack having first semiconductor nanostructures and second semiconductor nanostructures is then patterned to form fin-shape stacks of nanostructures. The second semiconductor layers in the channel regions of fin-shape stacks are then selectively removed to release the first semiconductor layers into suspended nanostructures, such as nanowires or nanosheets.

As illustrated in FIG. 2, the gate structures 220 extend lengthwise along Y direction, which is perpendicular to the X direction, along which the active region 204 extends. While not explicitly shown in FIG. 2, each of the gate structures 220 includes an interfacial layer, a gate dielectric layer, one or more work function layers, and a metal fill layer. In some embodiments, the interfacial layer may include a dielectric material such as silicon oxide or hafnium silicate. The gate dielectric layer is formed of a high-k (dielectric constant greater than about 3.9) dielectric material that may include $HfO_2$, $TiO_2$, $HfZrO$, $Ta_2O_3$, $HfSiO_4$, $ZrO_2$, $ZrSiO_2$, combinations thereof, or other suitable materials. The one or more work function layers may include n-type work function layers and p-type work function layers.

Example n-type work function layers may be formed of aluminum (Al), titanium aluminide (TiAl), titanium aluminum carbide (TiAlC), tantalum silicon aluminum (TaSiAl), tantalum silicon carbide (TaSiC), tantalum silicide carbide (TaC), or hafnium carbide (HfC). Example p-type work function layers may be formed of titanium nitride (TiN), titanium silicon nitride (TiSiN), tantalum nitride (TaN), tungsten carbonitride (WCN), or molybdenum (Mo). The metal fill layer may be formed of a metal, such as tungsten (W), ruthenium (Ru), cobalt (Co) or copper (Cu). Because the gate dielectric layer is formed of high-k dielectric material and the use of metal in gate structures 220, gate structures 220 may also be referred to high-k metal gate structures 220 or metal gate structures 220.

While not explicitly shown in FIG. 2, epitaxial source/drain features are formed in, on, or around the source/drain regions 204SD of the active region 204. As shown in FIG. 2, each of the channel regions 204C is sandwiched between two adjacent source/drain regions 204SD. The source/drain features may be epitaxially grown over the source/drain regions 204SD. Each of the channel regions 204C underlies the gate structure 220. Depending on the device types and design requirements, the epitaxial source/drain features may be doped with n-type dopants or p-type dopants. The source/drain contacts 240 are disposed over and electrically coupled to the source/drain features in the source/drain regions 204SD. For identification purposes, two of the source/drain contacts 240 are separately identified as a first source/drain contact 240-1 and a second source/drain contact 240-2. While not explicitly shown in the figures, a silicide feature may be disposed at the interface between a source/drain feature and a source/drain contact 240. The silicide feature may include titanium silicide, cobalt silicide, nickel silicide and functions to reduce contact resistance. The source/drain contacts 240 include tungsten (W), ruthenium (Ru), cobalt (Co), copper (Cu), titanium (Ti), titanium nitride (TiN), tantalum (Ta), tantalum nitride (TaN), molybdenum (Mo), or nickel (Ni). While not explicitly shown in FIG. 2, each of the source/drain contacts 240 are disposed in a first interlayer dielectric (ILD) layer. The first ILD layer may include a silicon oxide or silicon oxide containing material where silicon exists in various suitable forms. As an example, the first ILD layer includes silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide oxycarbonitride (SiOCN), spin-on silicon based polymeric dielectrics, or combinations thereof.

In some embodiments, the gate spacers 210 may be a single layer or a multi-layer. Example materials for the gate spacers 210 include silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), zirconium nitride (ZrN), or silicon carbonitride (SiCN). The material for the gate spacers 210 is selected such that the gate spacers 210 and the first ILD layer have different etching selectivity.

The top surfaces of the gate structures 220 are protected by the selectivity metal layer 230. The selectivity metal layer 230 functions to protect the gate structures 220 and to serve as an etch stop layer during the formation of a gate contact opening. The selectivity metal layer 230 may be formed of a metal that is different from the metal that forms the source/drain contacts 240. In some embodiments, the selectivity metal layer 230 may include tungsten (W), cobalt (Co), ruthenium (Ru), titanium nitride (TiN), or a combination thereof. As shown in FIG. 2, the selectivity metal layer 230 is disposed directly on the gate structure 220 and is disposed directly between two gate spacers 210 that line the gate structure 220. In some instances, the selectivity metal layer may have a thickness between about 1 nm and about 10 nm.

Referring still to FIG. 2, each of the SAC layers 250 is disposed over the selectivity metal layer 230. The SAC layers 250 may be formed of silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon carbide (SiC), zirconium nitride (ZrN), or silicon carbonitride (SiCN). According to the present disclosure, the SAC layers 250 may have different configurations. In some embodiments depicted in FIG. 2, each of the SAC layers 250 may include a bottom portion 250B and a top portion 250T over the bottom portion 250B. The dividing line between the top portion 250T and the bottom portion 250B is substantially level with the top surfaces of the gate spacers 210. The bottom portion 250B is defined vertically (along the Z direction) between the top surface of the gate structure 220 and a bottom surface of the top portion 250T; and horizontally (along the X direction) between the gate spacers 210 that line sidewalls of the gate structure 220. The top portion 250T is disposed over the gate spacers 210. In some instances, the top portion 250T may have a thickness between 1 nm and about 30 nm and the bottom portion 250B may have a thickness between about 1 nm and about 50 nm. The total thickness of the SAC layer 250 may be between about 2 nm and about 50 nm. It is noted that the SAC layers 250 may have other configurations. In some alternative embodiments represented in FIG. 14, the entirety of the SAC layer 250 may be disposed between two gate spacers 210 and the SAC layer 250 does not have different portions that have different dimensions. In some other embodiments represented in FIG. 15, top surfaces of the selectivity metal layer 230 and the gate spacers 210 are substantially coplanar and the entirety of the SAC layer 250 are disposed over the selectivity metal layer 230 and the gate spacers 210.

Figure 3:
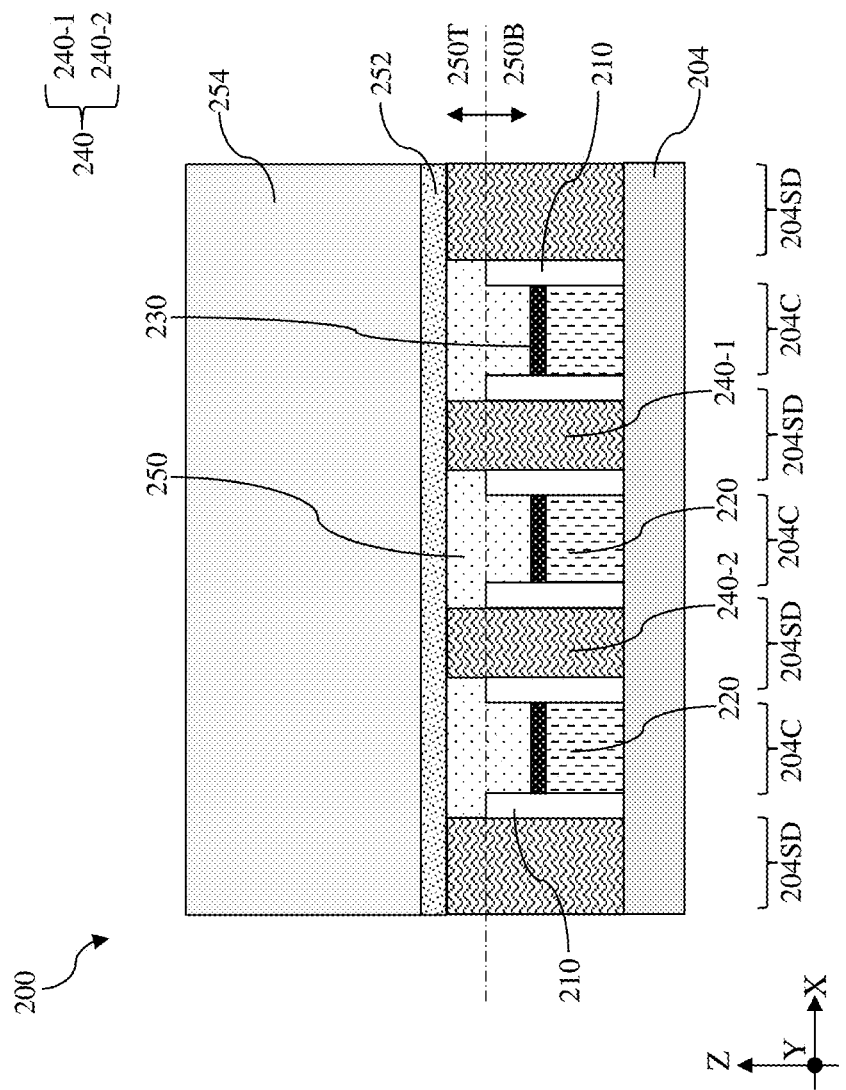

Referring to FIGS. 1 and 3, method 100 includes a block 104 where an etch stop layer (ESL) 252 and a second interlayer dielectric (ILD) layer 254 are deposited over the workpiece 200. In some embodiments, the ESL 252 may be formed of silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), zirconium nitride (ZrN), or silicon carbonitride (SiCN). In some implementations, the ESL 252 may be deposited using CVD, ALD, or a suitable deposition method. In one embodiment, the ESL 252 is formed of silicon nitride (SiN) and has a thickness between about 3 nm and about 20 nm. After the deposition of the ESL 252, block 104 deposits the second ILD layer 254 over the ESL 252. In some implementations, the second ILD layer 254 may include silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), or silicon carbonitride (SiCN). In one embodiment, the second ILD layer 254 may share the same composition with the first ILD layer. In that embodiment, the second ILD layer 254 may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. In some instances, the second ILD layer 254 may have a thickness between about 3 nm and about 40 nm.

Figure 4:
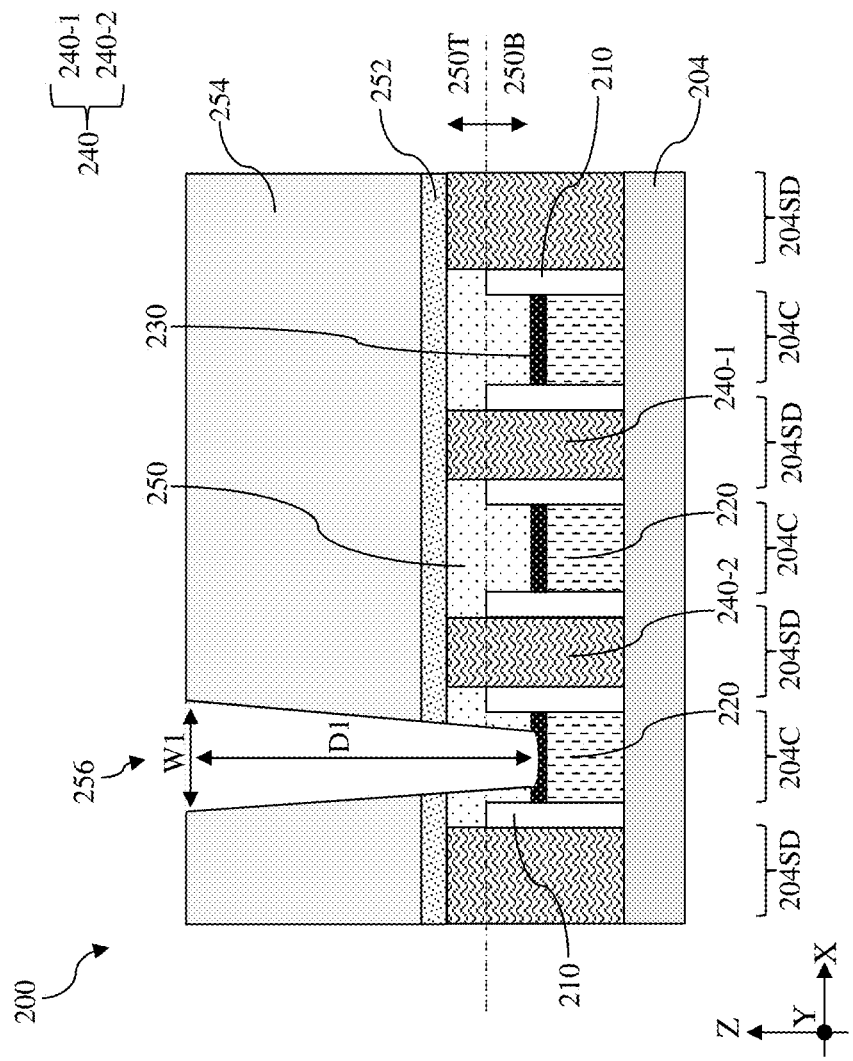

Referring to FIGS. 1 and 4, method 100 may include a block 106 where a gate contact opening 256 is formed through the second ILD layer 254, the ESL 252, and the SAC layer 250 to expose the selectivity metal layer 230 over the gate structure 220. A combination of photolithography processes and etching processes may be used to form the gate contact openings 256. For example, a photoresist layer is first deposited over the second ILD layer 254. The photoresist layer is then patterned using photolithography processes to form a patterned photoresist layer that exposes areas where the gate contact openings 256 are to be formed. The patterned photoresist layer is then used as an etch mask to form the gate contact openings 256 through the second ILD layer 254, the ESL 252, and the SAC layer 250 to expose top surfaces of the selectivity metal layer 230. In some implementations, the selectivity metal layer 230 may be partially etched and the gate contact opening 256 may terminate in the selectivity metal layer 230. The etch process at block 106 may be a dry etch process that implements oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4F_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

As shown in FIG. 4, the gate contact opening 256 may have a first depth D1 along the Z direction and a first opening width W1 along the X direction. In some instances, an aspect ratio of the gate contact opening 256 may be calculated as the first depth D1 divided by the first opening width W1. The aspect ratio of the gate contact opening 256 (i.e., D1/W1) may be between about 4 and about 9, which may pose challenges in satisfactorily filling metal fill layers into the gate contact opening 256 in a single-stage metal fill process. It is observed that a single-stage metal fill process may lead to voids or gaps in the already small gate contact, resulting in increased resistance.

Figure 5:
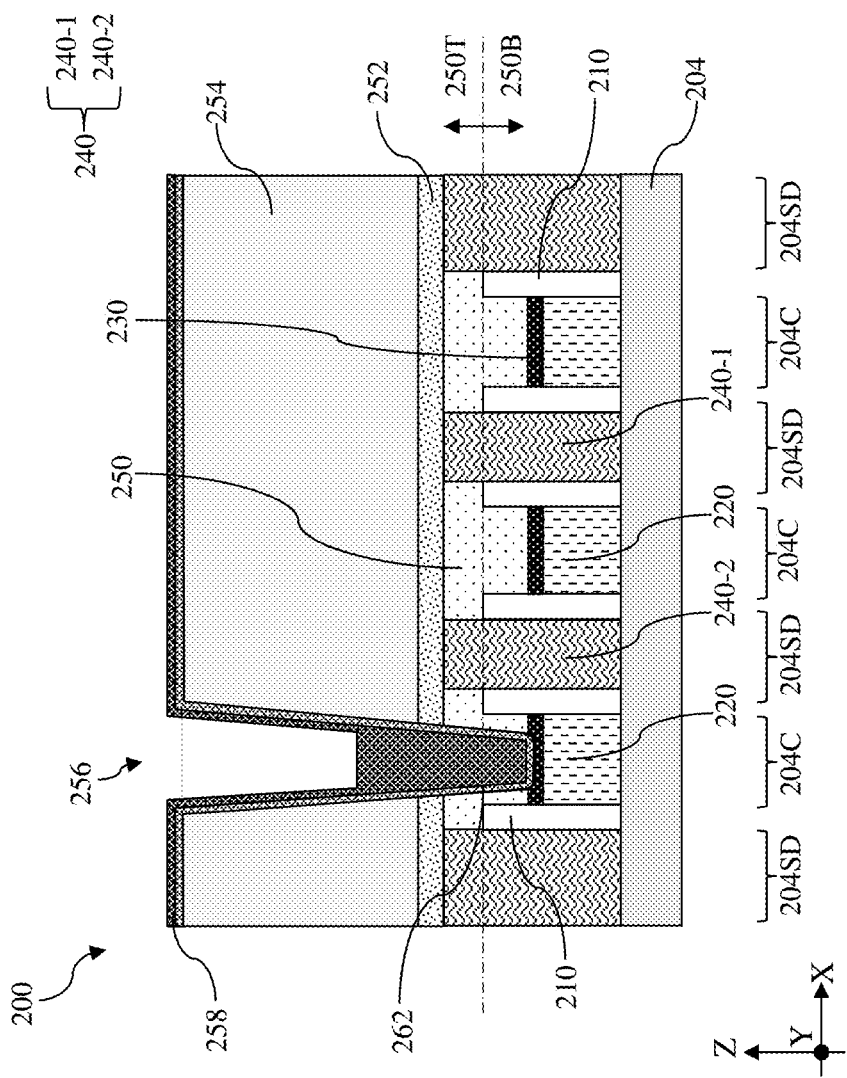
Figure 20:
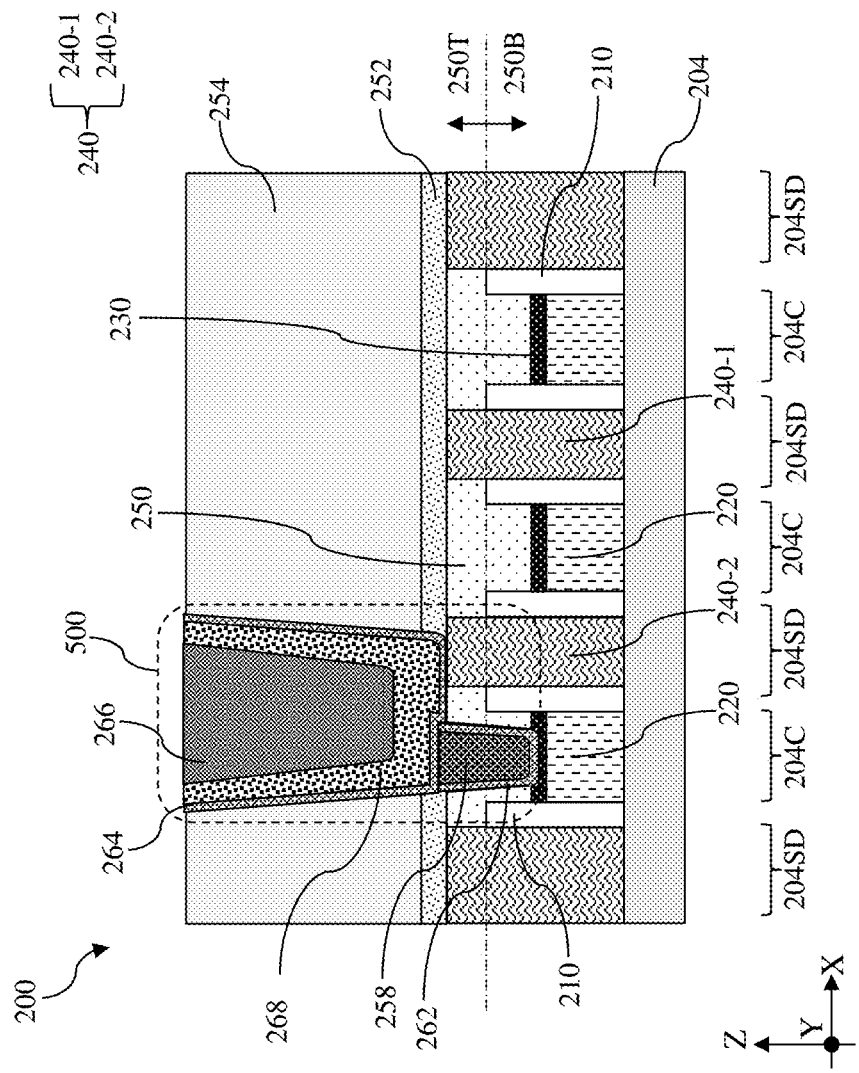
Figure 21:
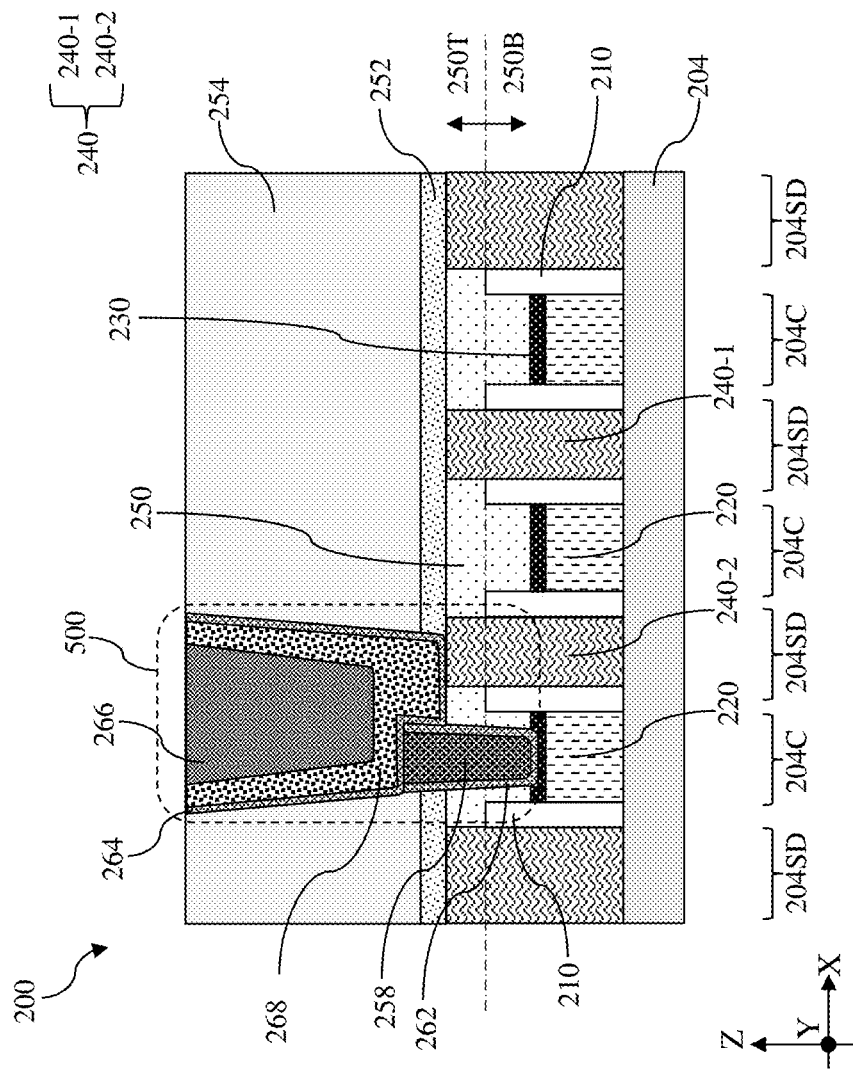

Referring to FIGS. 1 and 5, method 100 may optionally include a block 108 where a first glue layer 262 is deposited over the selectivity metal layer 230. The first glue layer 262 may serve to improve adhesion and to prevent deterioration of the first metal fill layer 258 (to be described below). In some embodiments, the first glue layer 262 may include cobalt (Co), tungsten (W), molybdenum (Mo), titanium (Ti), titanium nitride (TiN), tantalum nitride (TaN), or a combination thereof. In one embodiment, the first glue layer 262 may be formed of titanium nitride (TiN) or tantalum nitride (TaN). The first glue layer 262 may be deposited using chemical vapor deposition (CVD) or atomic layer deposition (ALD). In some instances, a thickness of the first glue layer 262, when formed, may have a thickness between about 1 Å and about 30 Å. In embodiments where the metal fill layer 258 adheres well to the selectivity metal layer 230 and the SAC layer 250 or is not prone to oxidation, the first glue layer 262 may be omitted. For example, when the first metal fill layer 258 (to be described below) is formed of titanium nitride (TiN) or tantalum nitride (TaN), the first glue layer 262 may be omitted. Embodiments where the first glue layer 262 is omitted are illustrated in FIGS. 11, 12, 14, 15, 16, 17, and 18. Embodiments where the first glue layer is formed are illustrated in FIGS. 13, 20 and 21.

Referring to FIGS. 1 and 5, method 100 includes a block 110 where a first metal fill layer 258 is formed in the gate contact opening 256. The first metal fill layer 258 is a conductive metal layer and may include tungsten (W), ruthenium (Ru), aluminum (Al), molybdenum (Mo), titanium (Ti), cobalt (Co), copper (Cu), or a combination thereof. In one embodiment, the first metal fill layer 258 may include cobalt (Co), copper (Cu), or ruthenium (Ru). In some implementations, the first metal fill layer 258 may be deposited using CVD or ALD. As shown in FIG. 5, the first metal fill layer 258 is deposited until a top surface of the first metal fill layer 258 in the gate contact opening 256 is higher than a top surface of the SAC layer 250. In some embodiments, after the deposition of the first metal fill layer 258, the top surface of the first metal fill layer 258 may be between about 0.5 nm and about 5 nm above or below the ESL 252. In some instances, as measured from the top surface of the selectivity metal layer 230, a height of the first metal fill layer 258 may be between about 5 nm and about 40 nm.

Figure 6:
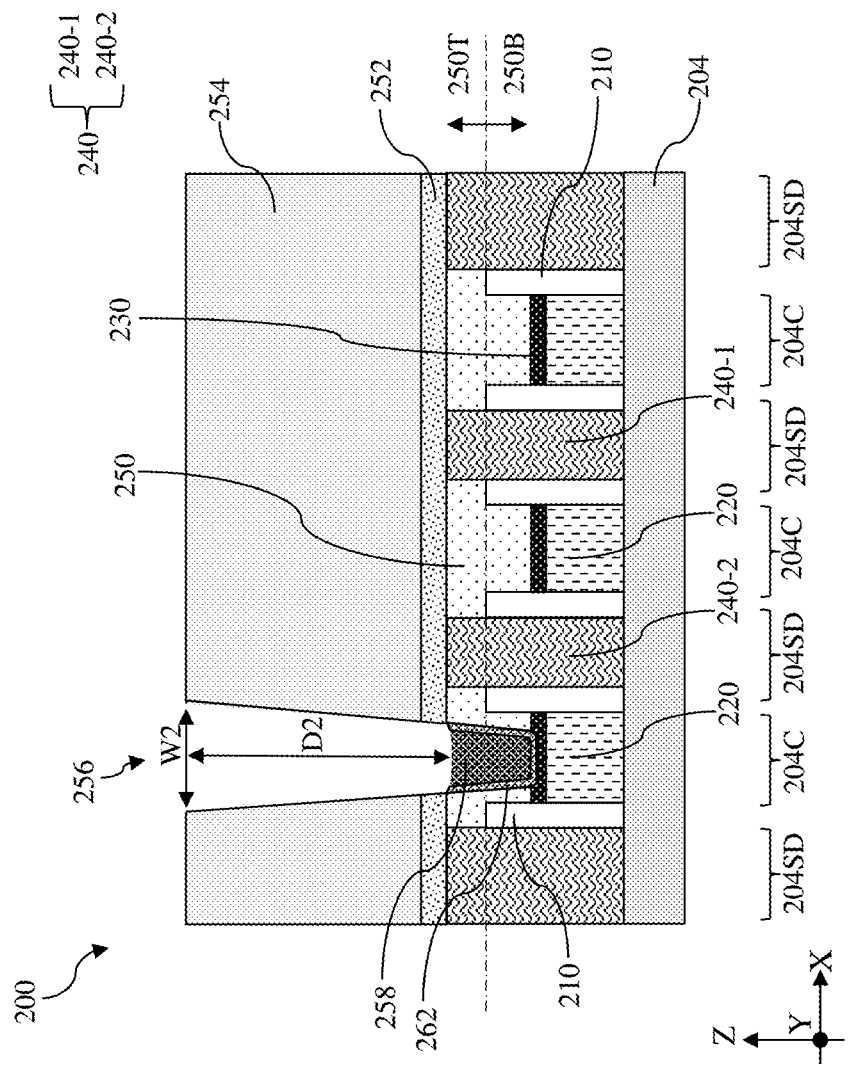

Referring to FIGS. 1 and 6, method 100 includes a block 112 where the deposited first metal fill layer 258 is etched back or pulled back. In some embodiments, the etch back at block 112 may include a dry etch process that implements oxygen ($O_2$), hydrogen ($H_2$), nitrous oxide ($N_2O$), nitrogen ($N_2$), a fluorine-containing gas (e.g., $CF_4$, $SF_6$, $NF_3$, $BF_3$, $CH_2F_2$, $CHF_3$, $CH_3F$, $C_4F_8$, $C_4F_6$, and/or $C_2F_6$), a chlorine-containing gas (e.g., $Cl_2$, $CHCl_3$, $CCl_4$, and/or $BCl_3$), other suitable gases and/or plasmas, and/or combinations thereof. At block 112, etchant gas species may be supplied at a flow rate between about 10 standard cubic centimeter (sccm) and about 300 sccm. In some implementations, the etch back is performed with a direct current (DC) bias between about 100 volts (V) and about 800 V, a temperature between about 20° C. and about 90° C., and a radio frequency (RF) power between about 100 watts (W) and 300 W. In the embodiments represented in FIG. 6, the pull back at block 112 is performed until the top surface of the first metal fill layer 258 is substantially coplanar with the top surface of the SAC layer 250. In some implementations, the etched first metal fill layer 258 may have a recess that extends into the first metal fill layer 258 by about 0.5 nm to about 10 nm. In some alternative embodiments represented in FIGS. 16 and 20, the pull back at block 112 is performed until the top surface of the first metal fill layer 258 is disposed between a bottom surface and a top surface of the ESL 252. In still some alternative embodiments represented in FIGS. 17 and 20, the pull back at block 112 is performed until the top surface of the first metal fill layer 258 remains higher than a top surface of the ESL 252.

As shown in FIG. 6, after the etch back at block 112, the gate contact opening 256 may have a second depth D2 along the Z direction and a second opening width W2 along the X direction. Due to the presence of the first metal fill layer 258, the second depth D2 is smaller than the first depth D1. Due to the etch back at block 112, the second opening width W2 may be slightly greater than the first opening width W1. As a result, after the operations at block 112, an aspect ratio of the gate contact opening 256 may be calculated as the second depth D2 divided by the second opening width W2. At this stage, due to the presence of the first metal fill layer 258, the aspect ratio of the gate contact opening 256 (i.e., D2/W2) may be between about 2 and about 6, which is smaller than the aspect ratio without the etched-back first metal fill layer 258. The reduced aspect ratio may improve the metal fill process window and reduce defects.

Figure 7:
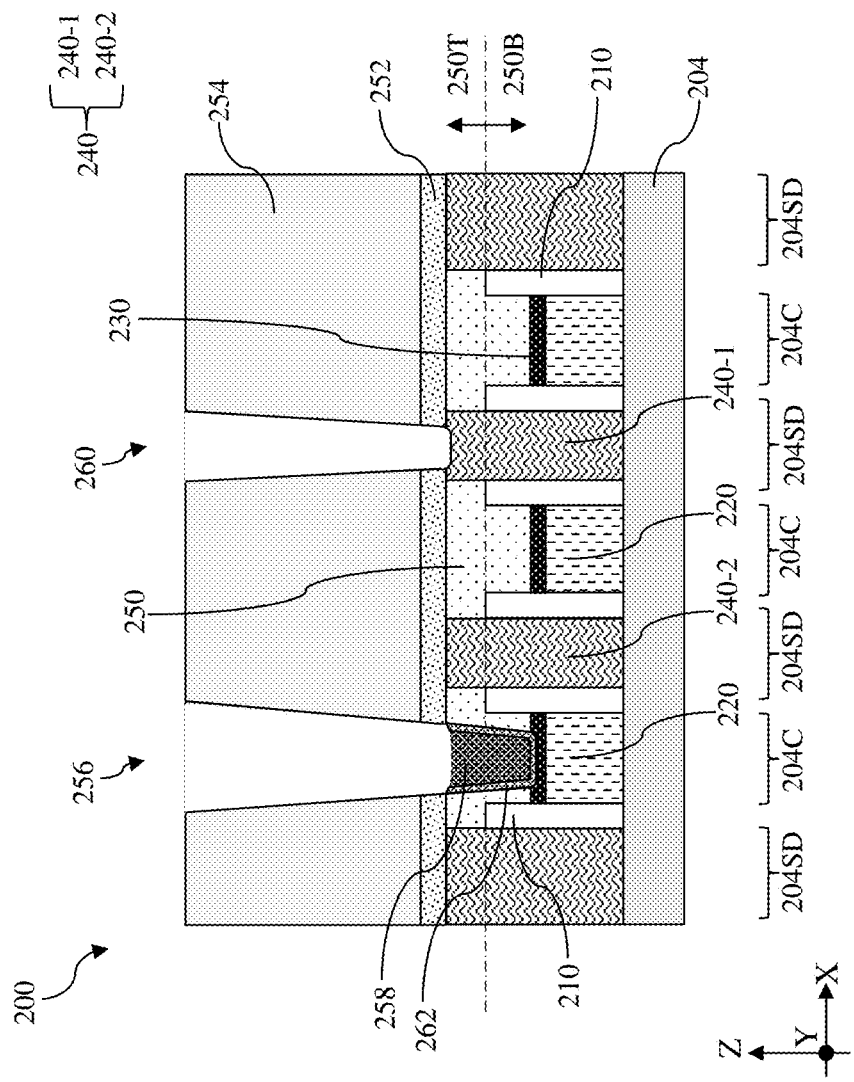

Referring to FIGS. 1 and 7, method 100 includes a block 114 where a source/drain contact via opening 260 is formed through the second ILD layer 254 and the ESL 252 to expose the first source/drain contact 240-1. After the etch back of the first metal fill layer 258, the source/drain contact via opening 260 is formed over the first source/drain contact 240-1. While not explicitly shown in FIG. 7, a patterned mask layer (such as a patterned photoresist layer, a patterned hard mask layer, or a patterned bottom antireflective coating (BARC) layer) may be formed over the workpiece 200. The patterned mask layer protects or covers the gate contact opening 256 while exposes the area over the first source/drain contact 240-1. Using the patterned mask layer, the workpiece 200 is subject to a dry etch process to form the source/drain contact via opening 260 through the second ILD layer 254 and the ESL 252. The dry etch process at block 114 may include use of oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4F_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In the depicted embodiment, the first source/drain contact 240-1 may be partially etched and the source/drain contact via opening 260 may terminate in the first source/drain contact 240-1. After the formation of the source/drain contact via opening 260, the patterned mask layer is removed by ashing or etching.

Figure 8:
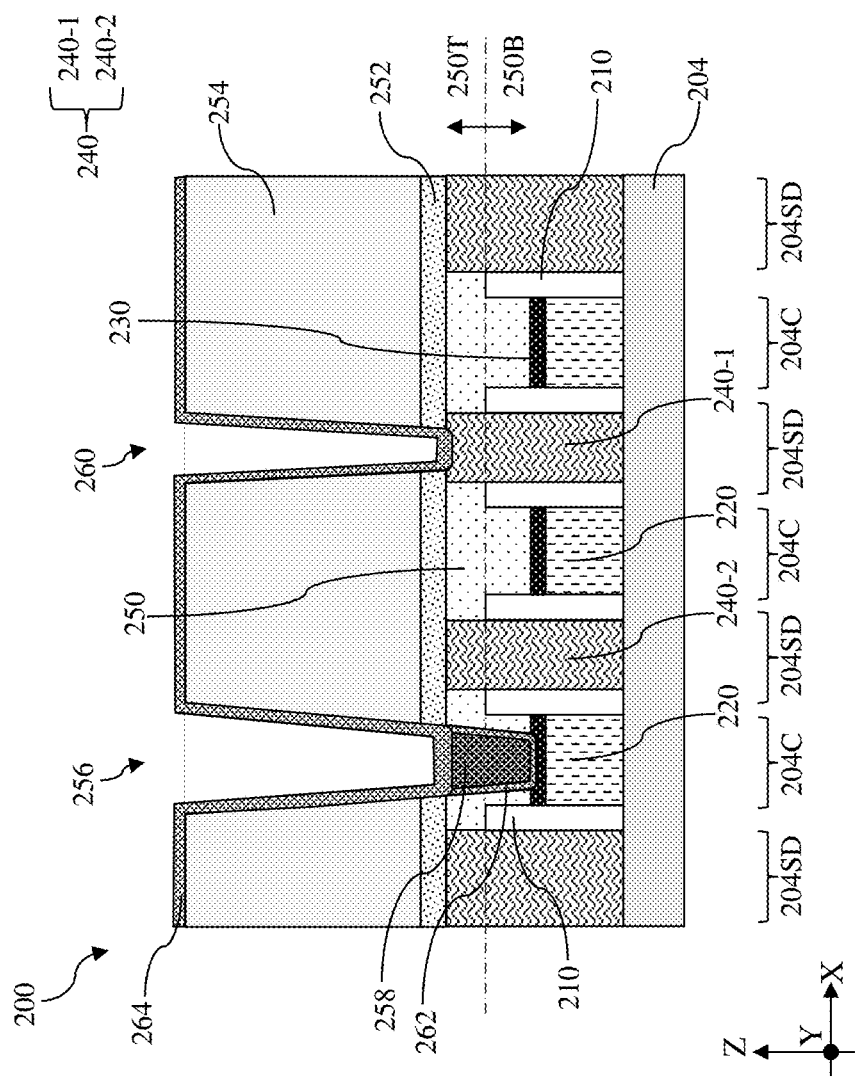

Referring to FIGS. 1 and 8, method 100 may optionally include a block 116 where a second glue layer 264 is deposited over the workpiece 200. The second glue layer 264 may serve to improve adhesion and to prevent deterioration of the second metal fill layer 266 (to be described below). In some embodiments, the second glue layer 264 may include cobalt (Co), tungsten (W), molybdenum (Mo), titanium (Ti), titanium nitride (TiN), tantalum nitride (TaN), or a combination thereof. In one embodiment, the second glue layer 264 may be formed of titanium nitride (TiN). The second glue layer 264 may be conformally deposited over the workpiece 200 using CVD or ALD. As illustrated in FIG. 8, the second glue layer 264 is disposed on top surfaces and sidewalls of the second ILD layer 254, sidewalls of the ESL 252, the top surface of the etched-back first metal fill layer 258, the top surface of the first glue layer 262 (if formed), and the top surface of the first source/drain contact 240-1. In some instances, the second glue layer 264 (when formed) may have a thickness between about 1 Å and about 30 Å. In embodiments where the second metal fill layer 266 (to be described below) adheres well to the first metal fill layer 258, the ESL 252, and the second ILD layer 254 or is not prone to oxidation, the second glue layer 264 may be omitted. For example, when the second metal fill layer 266 (to be described below) is formed of titanium nitride (TiN) or tantalum nitride (TaN), the second glue layer 264 may be omitted. Embodiments where the second glue layer 264 is omitted are illustrated in FIGS. 11 and 13. Embodiments where the second glue layer 264 is formed are illustrated in FIGS. 10, 12, and 14-21.

Figure 9:
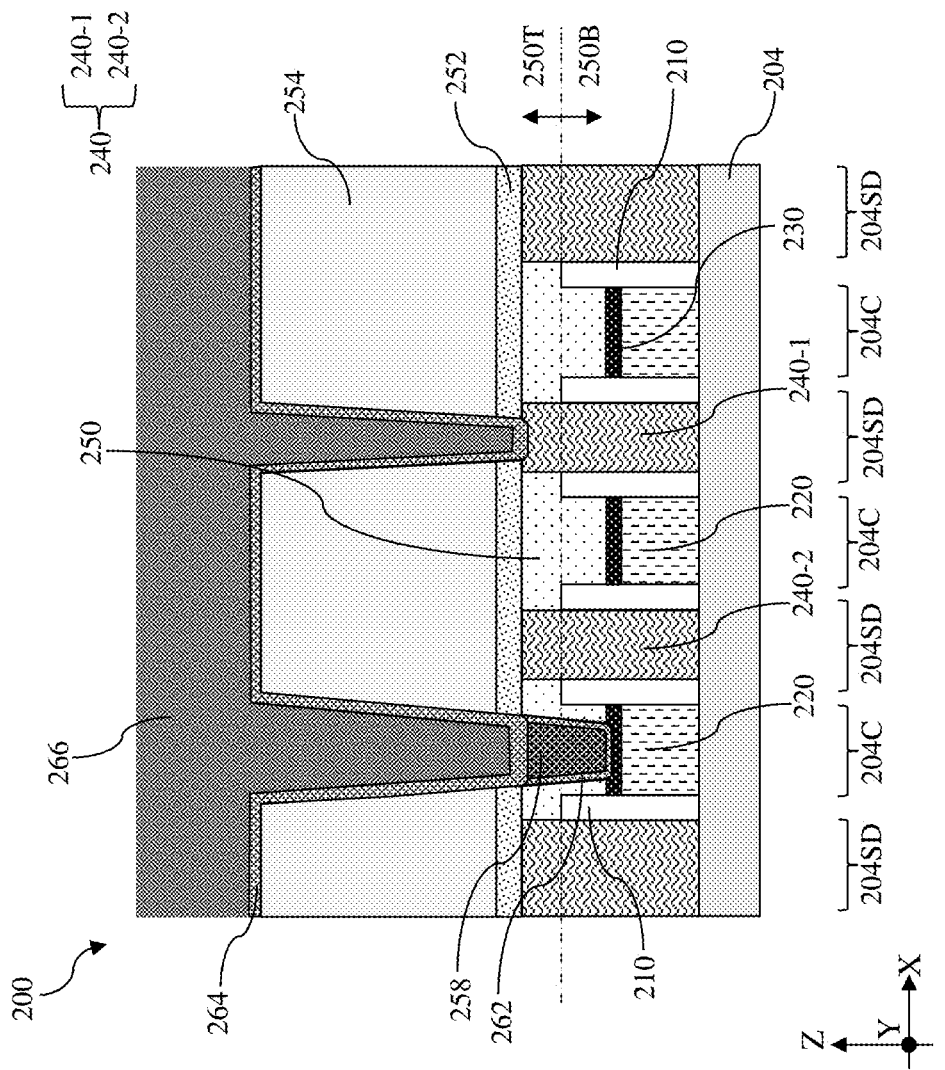

Referring to FIGS. 1 and 9, method 100 includes a block 118 where a second metal fill layer 266 is deposited over the workpiece 200. The second metal fill layer 266 is a conductive metal layer and may include tungsten (W), ruthenium (Ru), aluminum (Al), molybdenum (Mo), titanium (Ti), cobalt (Co), copper (Cu), or a combination thereof. In some implementations, the second metal fill layer 266 may be deposited using CVD or ALD over the workpiece 200, including over the gate contact opening 256 (shown in FIG. 8) and the source/drain contact via opening 260 (shown in FIG. 8). When the second glue layer 264 is not formed, the deposited second metal fill layer 266 may come in direct contact with the first metal fill layer 258, the first glue layer 262 (if present), and the first source/drain contact 240-1. In some implementations, a composition of the second metal fill layer 266 may be different from a composition of the first metal fill layer 258. For example, the first metal fill layer 258 may be formed of tungsten (W) or cobalt (Co) and the second metal fill layer 266 may be formed of ruthenium (Ru). In this example, the precursors and deposition processes of tungsten (W) and cobalt (Co) provide needed bottom-up formation capability such that less first metal fill layer 258 is deposited along the dielectric sidewalls. Additionally, when the first metal fill layer 258 is formed of tungsten (W) or cobalt (Co), it provides etching selectivity between itself and the dielectric layers, such as the ESL 252, and the second ILD layer 254. The second metal fill layer 266 does not need such etching selectivity. In some alternative implementations, the composition of the second metal fill layer 266 may be the same as the composition of the first metal fill layer 258. In these alternative implementations, while the first metal fill layer 258 and the second metal fill layer 266 share the same composition, an interface may still be present and readily detectable as the two metal fill layers are formed separately.

Figure 10:
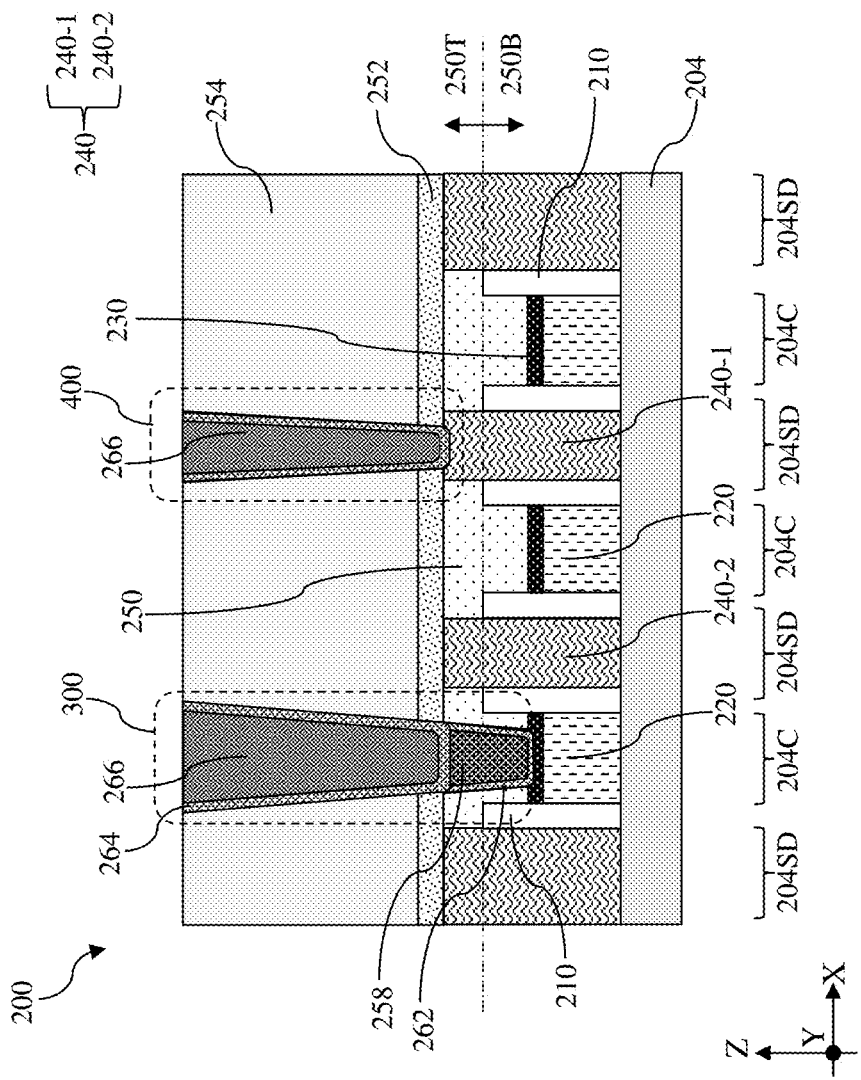
Figure 11:
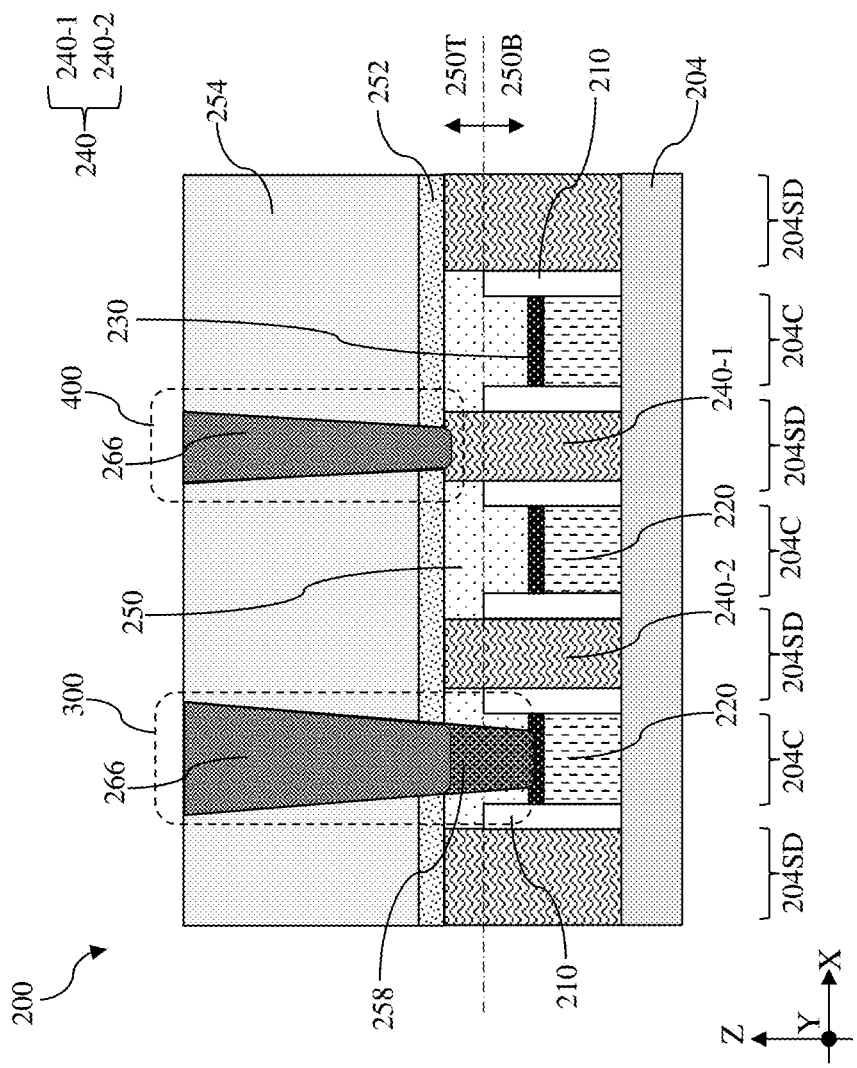

Referring to FIGS. 1 and 10, method 100 includes a block 120 where the workpiece 200 is planarized to form a gate contact 300 and a source/drain contact via 400. After the deposition of the second metal fill layer 266, the workpiece 200 is subject to a planarization process, such as a chemical mechanical polishing (CMP) process. The planarization process at block 120 is performed until the second glue layer 264 (if present) and the second metal fill layer 266 over the top surface of the second ILD layer 254 are completely removed. Upon conclusion of the operations at block 120, the gate contact 300 and the source/drain contact via 400 are formed, as illustrated in FIG. 10. In the embodiment depicted in FIG. 10, the gate contact 300 includes a lower portion and an upper portion disposed over the lower portion. The lower portion includes the first glue layer 262 and the first metal fill layer 258 and the upper portion includes the second glue layer 264 and the second metal fill layer 266. The upper portion of the gate contact 300 extends through the second ILD layer 254 and the ESL 252. In some instances, the upper portion may partially extend into the first metal fill layer 258. The lower portion of the gate contact 300 extends through the SAC layer 250 and may partially extend into the selectivity metal layer 230. In other words, the upper portion is disposed in the second ILD layer 254 and the ESL 252 and the lower portion is disposed in the SAC layer 250. The source/drain contact via 400 extends through the second ILD layer 254 and the ESL 252. In some instances, the source/drain contact via 400 may partially extend into the first source/drain contact 240-1.

FIGS. 11-21 illustrate example alternative embodiments of the gate contacts 300 and the source/drain contact via 400 that may be formed using the method 100 described above. It is noted that the example alternative embodiments illustrated in FIGS. 11-21 are not exhaustive and the present disclosure contemplates other combinations of features or processes disclosed herein. FIG. 11 illustrates an embodiment where operations at blocks 108 and 116 are omitted. As illustrated in FIG. 11, due to lack of the first glue layer 262 and the second glue layer 264, the first metal fill layer 258 is in direct contact with the selectivity metal layer 230 and the second metal fill layer 266 is in direct contact with the first metal fill layer 258. As described above, even when the first metal fill layer 258 and the second metal fill layer 266 in the gate contact 300 in FIG. 11 share the same composition, the interface between the first metal fill layer 258 and the second metal fill layer 266 may be readily detectable. The source/drain contact via 400 in FIG. 11 is in direct contact with the first source/drain contact 240-1.

Figure 12:
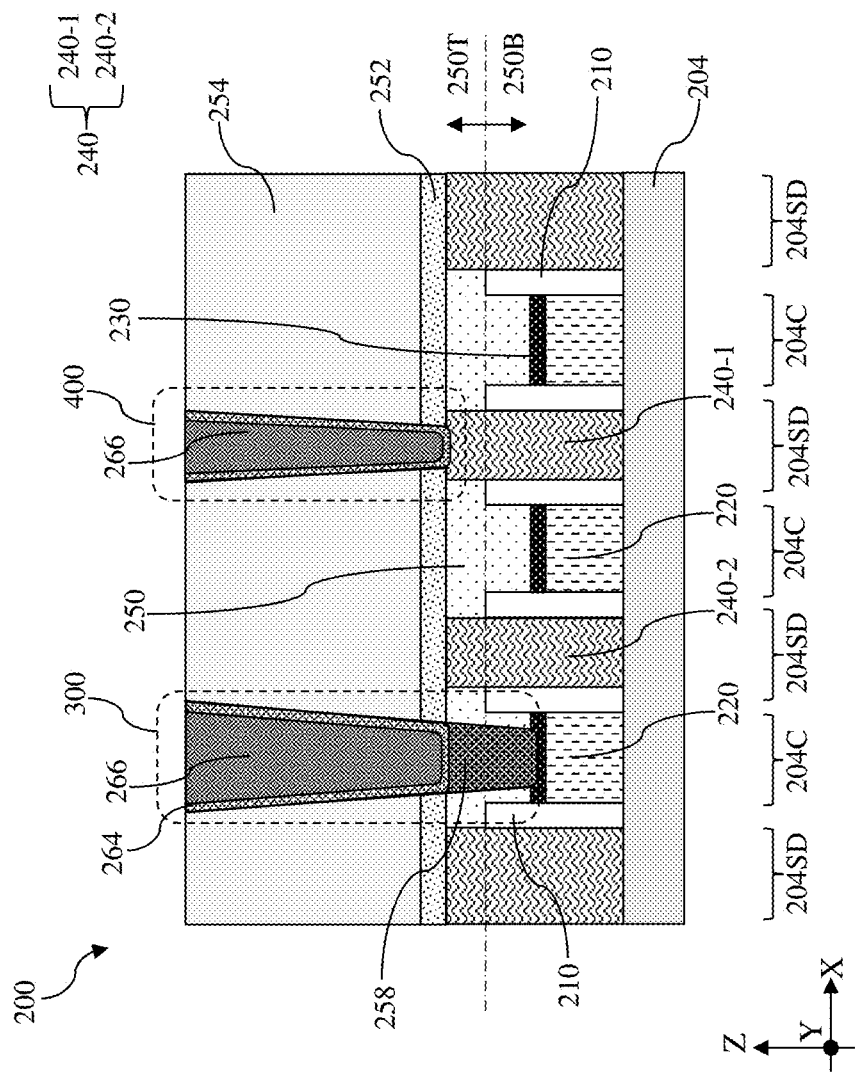
Figure 13:
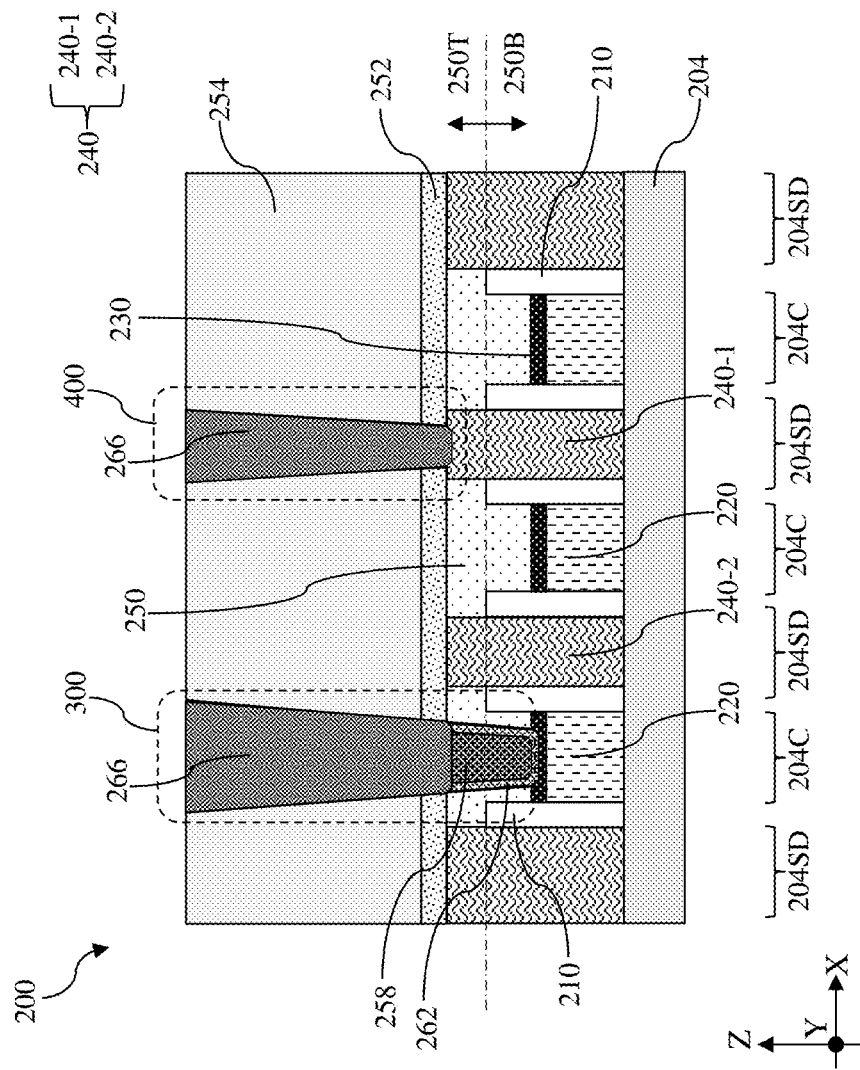

FIG. 12 illustrates an embodiment where operations at block 108 are omitted. As illustrated in FIG. 12, due to lack of the first glue layer 262, the first metal fill layer 258 is in direct contact with the selectivity metal layer 230 while the second metal fill layer 266 is spaced apart from the first metal fill layer 258 by the second glue layer 264. The source/drain contact via 400 in FIG. 12 is substantially similar to the source/drain contact via 400 shown in FIG. 10.

FIG. 13 illustrates an embodiment where operations at block 116 are omitted. As illustrated in FIG. 13, due to lack of the second glue layer 264, the second metal fill layer 266 in the gate contact 300 is in direct contact with the first metal fill layer 258 and the first glue layer 262. The source/drain contact via 400 in FIG. 13 is in direct contact with the first source/drain contact 240-1 and is similar to the source/drain contact via 400 shown in FIG. 11.

Figure 14:
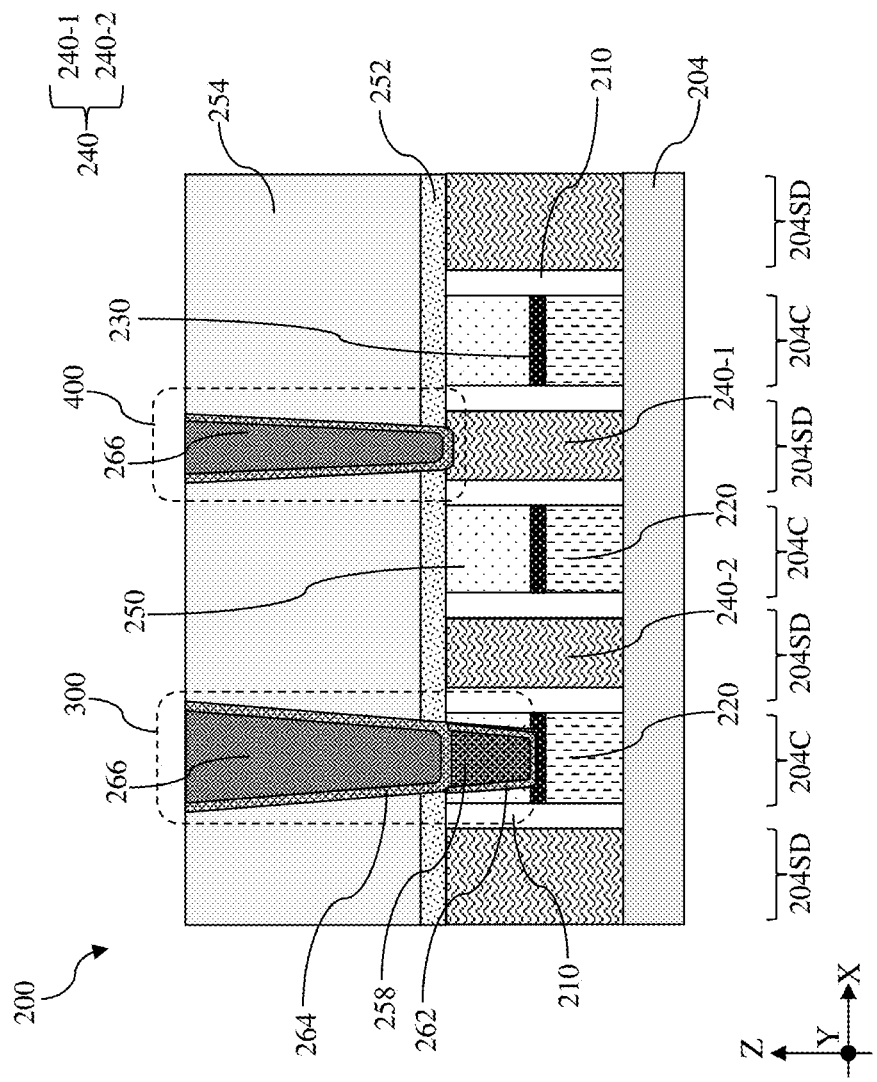

FIG. 14 illustrates an embodiment where the workpiece 200 received at block 102 includes an SAC layer 250 that is disposed between gate spacers 210 in its entirely. In this embodiment, no part of the SAC layer 250 is disposed over the gate spacers 210. The SAC layer 250 in FIG. 14 includes a uniform width throughout its height and does not include a discernable upper portion or lower portion.

Figure 15:
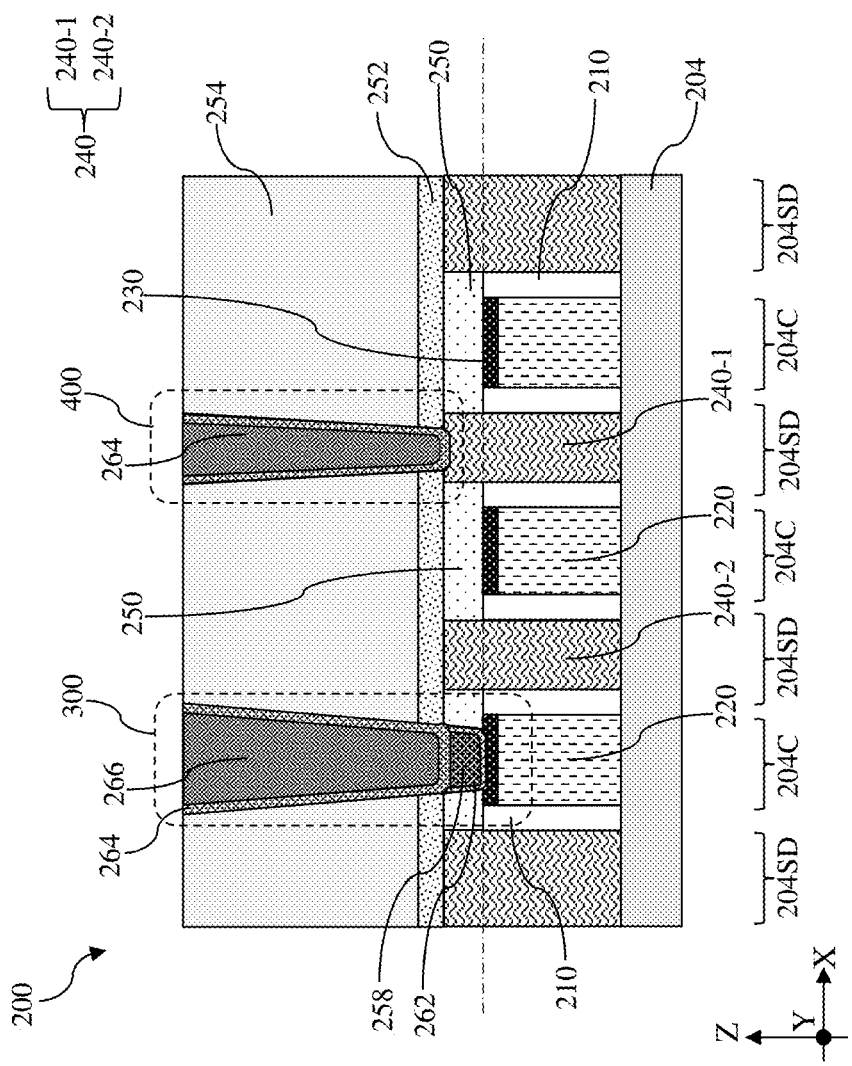

FIG. 15 illustrates an embodiment where the workpiece 200 received at block 102 includes an SAC layer 250 that is not disposed between gate spacers 210. In the embodiment shown in FIG. 15, top surfaces of the selectivity metal layer 230 and top surfaces of the gate spacers 210 are substantially coplanar and the SAC layer 250 is disposed on such a coplanar surface. The SAC layer 250 in FIG. 15 includes a uniform width throughout its height and does not include a discernable upper portion or lower portion.

Figure 16:
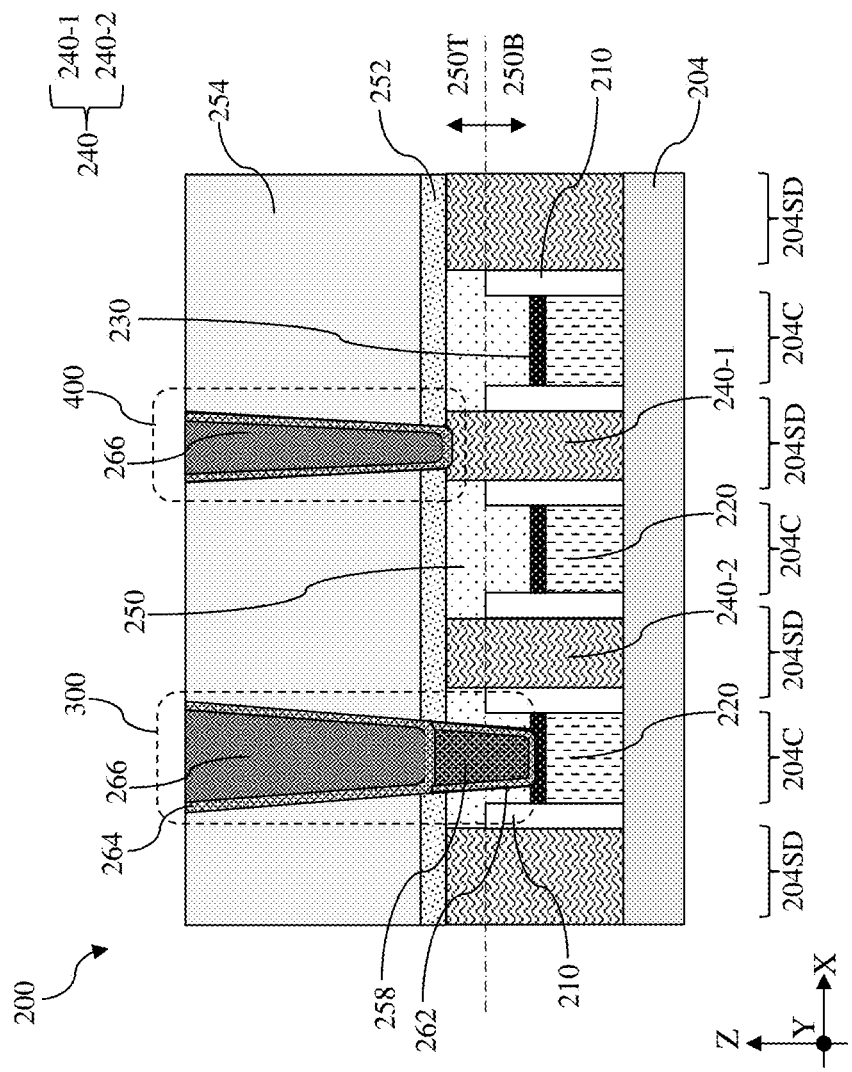

FIG. 16 illustrates an embodiment where the etch back at block 112 is performed until the top surface of the first metal fill layer 258 is between the top surface of the ESL 252 and the bottom surface of the ESL 252. The raised top surface of the first metal fill layer 258 may further reduce the aspect ratio of the gate contact opening 256 right before the deposition of the second metal fill layer 266. The raised top surface of the first metal fill layer 258 may be devised to accommodate process variations and to improve overall yield.

Figure 17:
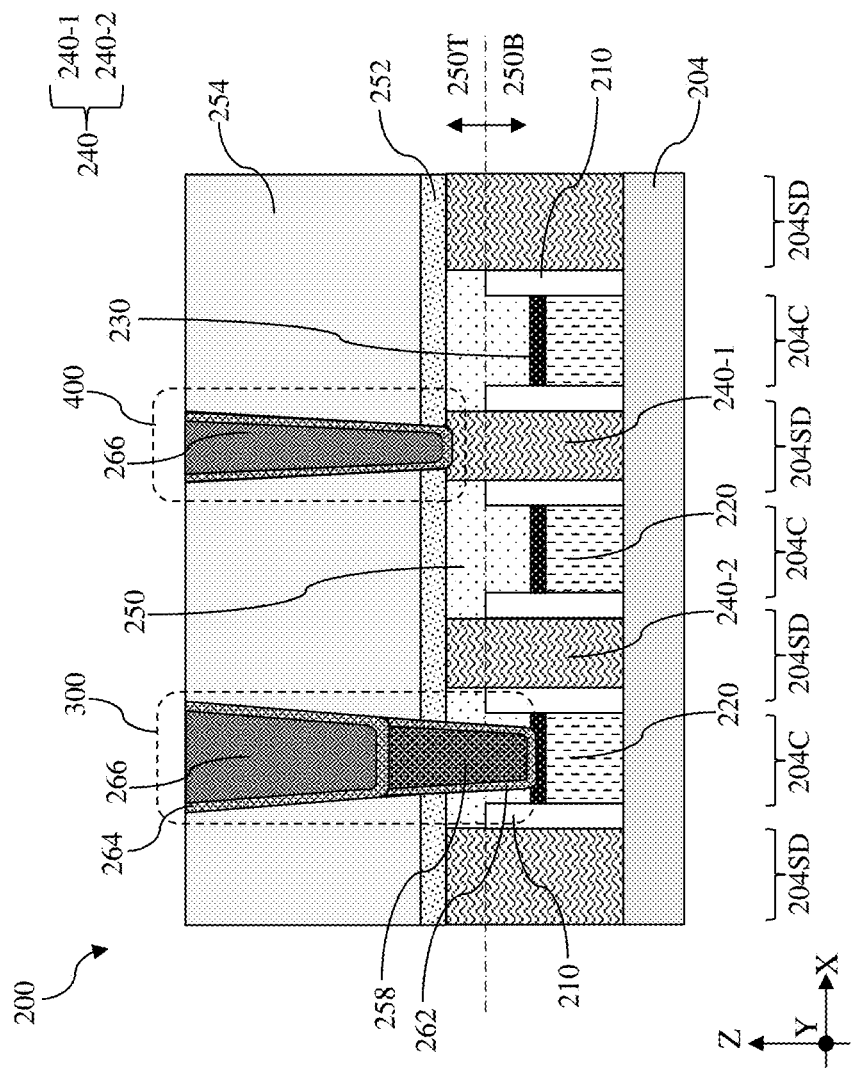

FIG. 17 illustrates an embodiment where the etch back at block 112 is performed until the top surface of the first metal fill layer 258 is higher than the top surface of the ESL 252. The further raised top surface of the first metal fill layer 258 may further reduce the aspect ratio of the gate contact opening 256 right before the deposition of the second metal fill layer 266. The raised top surface of the first metal fill layer 258 may be devised to accommodate process variations and to improve overall yield.

Figure 18:
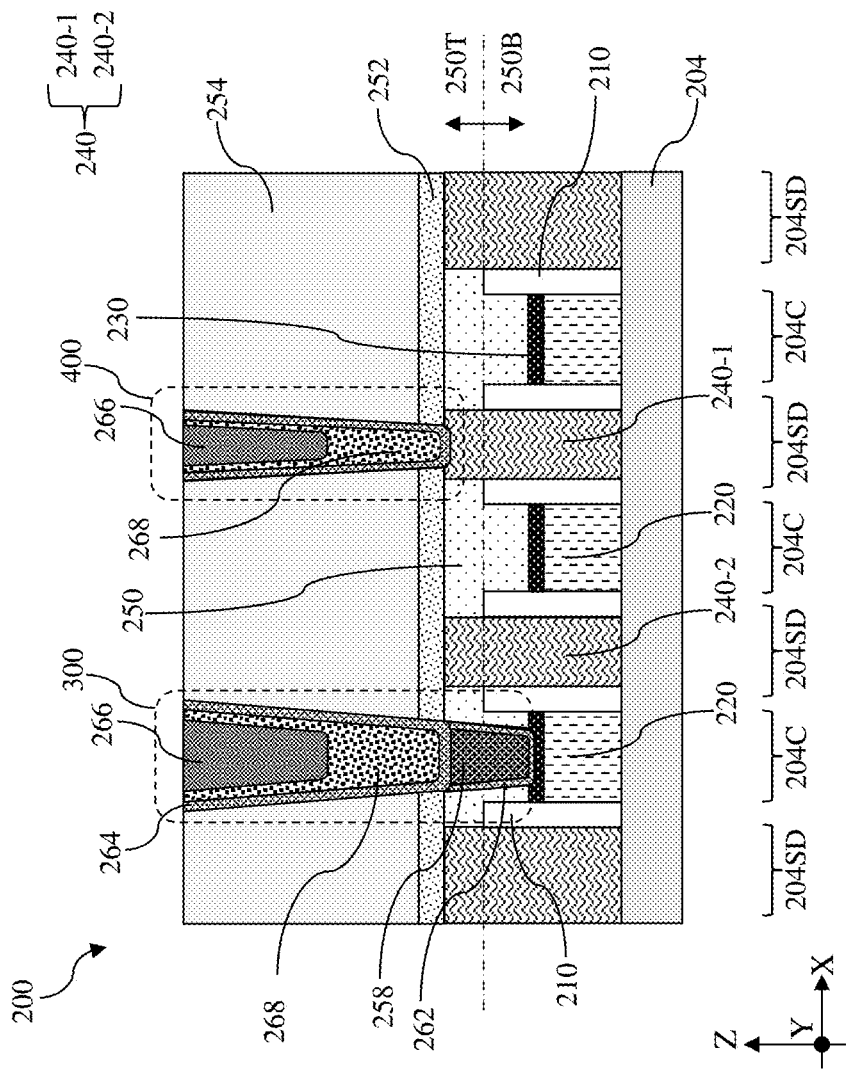

FIG. 18 illustrates an embodiment where an additional metal fill layer is deposited before the deposition of the second metal fill layer 266. Referring to FIG. 18, after the etch back of the first metal fill layer 258 at block 112 (or after the deposition of the second glue layer 264 at block 114, if formed) and before the deposition of the second metal fill layer 266 at block 118, a middle metal fill layer 268 is deposited into the gate contact opening 256 and the source/drain contact via opening 260 using CVD or ALD. In some implementations, the middle metal fill layer 268 may include tungsten (W), ruthenium (Ru), aluminum (Al), molybdenum (Mo), titanium (Ti), cobalt (Co), copper (Cu), or a combination thereof. After the deposition of the middle metal fill layer 268, method 100 proceeds to block 118 where the second metal fill layer 266 is deposited. In some alternative embodiments, the middle metal fill layer 268 may be subject to an etch back process before the deposition of the second metal fill layer 266. In the embodiments represented in FIG. 18, the introduction of the middle metal fill layer 268 transform the two-stage metal filling process in method 100 into a three-stage metal filling process. The additional metal filling stage allows low-aspect-ratio metal filling and improves the metal fill process window, thereby avoid void formation in the gate contact 300 or the source/drain contact via 400. The middle metal fill layer 268 may also allow use of highly conductive material in the second metal fill layer 266 that does not have good hole filling properties. In one example, the first metal fill layer 258 is formed of ruthenium (Ru), the middle metal fill layer 268 is formed of cobalt (Co), and the second metal fill layer 266 is formed of copper (Cu). Out of the three materials, the deposition of the ruthenium (Ru) and cobalt (Co) has better gap filling capability but slightly inferior conductivity. The gap filling capability of deposition of copper (Cu) is not as good as that for ruthenium (Ru) or cobalt (Co) but copper (Cu) is more conductive than those ruthenium (Ru) and cobalt (Co). In some instances, the thickness of the middle metal fill layer 268 measured from sidewalls of the gate contact opening 256 or sidewalls of the second glue layer 264 (when formed) may be between about 1 nm and about 20 nm.

In the embodiments presented in FIG. 18, the gate contact 300 includes a lower portion and an upper portion disposed over the lower portion. The lower portion includes the first glue layer 262 (when formed) and the first metal fill layer 258. The upper portion includes the second glue layer 264 (when formed), the middle metal fill layer 268, and the second metal fill layer 266. In the depicted embodiment, the second metal fill layer 266 is spaced part from the second ILD layer 254 by the second glue layer 264 (when formed) and the middle metal fill layer 268. Additionally, the second metal fill layer 266 is spaced apart from the first metal fill layer 258 by the middle metal fill layer 268 and the second glue layer 264 (when formed). Put differently, in the embodiments shown in FIG. 18, the second metal fill layer 266 may be referred to as an inner layer while the middle metal fill layer 268 may be referred to as an outer layer. The outer layer wraps around the sidewalls and the bottom surface of the inner layer. In the embodiments represented in FIG. 18, the source/drain contact via 400 includes the second glue layer 264 (when formed), the middle metal fill layer 268 over the second glue layer 264 (when formed), and the second metal fill layer 266 over the middle metal fill layer 268. The source/drain contact via 400 shares a similar construction with the upper portion of the gate contact 300 shown in FIG. 18.

Figure 19:
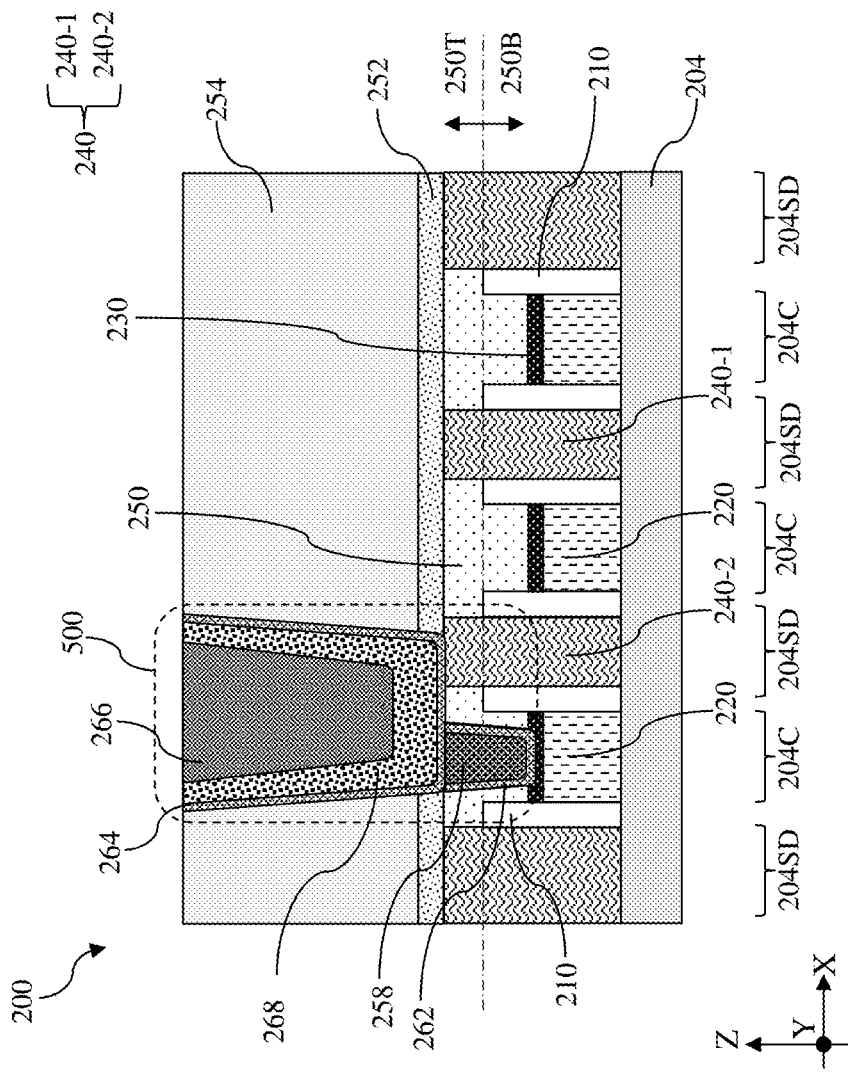

FIGS. 19-21 illustrate a combination gate contact 500 that may also be formed using method 100. Some circuit design may require that a gate structure 220 be shorted to the adjacent second source/drain contact 240-2. The combination gate contact 500 in FIGS. 19-20 functions as a gate contact, a source/drain contact via, and a local interconnect that electrically couple the gate contact and the source/drain contact via. When such a combination gate contact 500 is desired, operations at blocks 102 to 112 are performed as described above. At block 114, the source/drain contact via opening 260 is formed directly over the second source/drain contact 240-2, instead of over the first source/drain contact 240-1. Due to its proximity to the gate structure, the source/drain contact via opening 260 is allowed to merge with the gate contact opening 256 that is partially filled by the etched-back first metal fill layer 258, thereby forming a merged opening. The merged opening spans over the first metal fill layer 258, the SAC layer 250, and the second source/drain contact 240-2. Operations in the subsequent blocks are then performed to the merged opening. In the depicted embodiment, the second glue layer 264 (when formed), the middle metal fill layer 268, and the second metal fill layer 266 are sequentially deposited over the merged opening. After the planarization at block 120, the combination gate contact 500 in FIGS. 19-21 is formed. It is noted that the first glue layer 262, the second glue layer 264, and the middle metal fill layer 268 shown in FIGS. 19-21 are optional, as similarly described above. While not explicitly shown in FIGS. 18-21, the SAC layer 250 may have various configurations shown in FIG. 10, 14 or 15.

The combination gate contact 500 in FIGS. 19-21 also includes a lower portion and an upper portion over the lower portion. The lower portion includes the first glue layer 262 (when formed) and the first metal fill layer 258. The upper portion includes the second glue layer 264 (when formed), the middle metal fill layer 268 (when formed), and the second metal fill layer 266. Different from the upper portions of other embodiments shown in FIGS. 10-18, the upper portion of the combination gate contact 500 in FIGS. 19-21 spans over the gate structure 220, the SAC layer 250, and the second source/drain contact 240-2, thereby electrically connecting the gate structure 220 and the second source/drain contact 240-2. The upper portion of the combination gate contact 500 come in direct contact with the first metal fill layer 258, the first glue layer 262 (when formed), the SAC layer 250, and the second source/drain contact 240-2. Differences in the combination gate contact 500 in FIGS. 19-21 lie in the height of the lower portion of the combination gate contact 500. In FIG. 19, the top surface of the lower portion is substantially coplanar with the top surface of the SAC layer 250. In FIG. 20, the top surface of the lower portion is between the bottom surface of the ESL 252 and the top surface of the ESL 252. In FIG. 21, the top surface of the lower portion is above the top surface of the ESL 252. That is, the lower portion terminates in the second ILD layer 254.

Referring to FIG. 1, method 100 includes a block 122 where further processes are performed. Such further processes may include process for forming further structures for interconnecting devices fabricated in the workpiece 200. For the example, such further processes may include deposition of an ILD layer over the workpiece 200, formation of metal lines, and formation of further contact vias.

Thus, the various embodiments described herein offer several advantages over the existing art. It will be understood that not all advantages have been necessarily discussed herein, no particular advantage is required for all embodiments, and other embodiments may offer different advantages. For example, methods of the present disclosure fill the gate contact opening in a two-stage or three-stage metal fill process. The multi-stage metal fill processes of the present disclosure reduce the aspect ratios of the gate contact openings for the metal fill process, thereby enlarging metal fill windows and reducing contact resistance.

Thus, one of the embodiments of the present disclosure provides a semiconductor structure. The semiconductor structure includes an active region over a substrate, a gate structure disposed over the active region, and a gate contact including a lower portion disposed over the gate structure, and an upper portion disposed over the lower portion. In some embodiments, the semiconductor structure may further include a first glue layer disposed between the lower portion and the gate structure. In some embodiments, the semiconductor structure may further include a second glue layer disposed between the lower portion and the upper portion. In some implementations, the semiconductor structure may further include a middle metal fill layer disposed between the second glue layer and the upper portion. The middle metal fill layer includes tungsten (W), ruthenium (Ru), aluminum (Al), molybdenum (Mo), titanium (Ti), cobalt (Co), copper (Cu), or a combination thereof. In some implementations, the second glue layer includes cobalt (Co), tungsten (W), molybdenum (Mo), titanium (Ti), titanium nitride (TiN), tantalum nitride (TaN), or a combination thereof. In some instances, the lower portion and the upper portion includes tungsten (W), ruthenium (Ru), aluminum (Al), molybdenum (Mo), titanium (Ti), cobalt (Co), copper (Cu), or a combination thereof. In some embodiments, the semiconductor structure may further include a selectivity metal layer over the gate structure and a self-aligned capping (SAC) layer over the selectivity metal layer. The lower portion terminates on the selectivity metal layer. In some implementations, the selectivity metal layer comprises tungsten (W), cobalt (Co), ruthenium (Ru), or titanium nitride (TiN). In some instances, the semiconductor structure may further include an etch stop layer (ESL) over the SAC layer and a dielectric layer over the ESL. The gate contact extends through the dielectric layer, the ESL, and the SAC layer. In some instances, the SAC layer includes lanthanum oxide, aluminum oxide, yittrium oxide, tantalum carbonitride, zirconium silicide, silicon oxycarbonitride, silicon oxycarbide, silicon carbonitride, zirconium nitride, zirconium aluminum oxide, titanium oxide, tantalum oxide, zirconium oxide, hafnium oxide, silicon nitride, hafnium silicide, aluminum oxynitride, silicon oxide, silicon carbide, or zinc oxide.

In another of the embodiments, a semiconductor structure is provided. The semiconductor structure includes an active region over a substrate, a gate structure disposed over a channel region of the active region, a source/drain contact disposed over a source/drain region of the active region, a selectivity metal layer on the gate structure, and a gate contact that includes a lower portion in direct contact with the selectivity metal layer, and an upper portion spanning over and electrically coupled to the lower portion and the source/drain contact.

In some embodiments, the semiconductor structure may further include a self-aligned capping (SAC) layer over the selectivity metal layer, an etch stop layer (ESL) over the SAC layer, and a dielectric layer over the ESL. The lower portion extends through the SAC layer and the upper portion extends through the dielectric layer. In some implementations, the lower portion also extends through the ESL. In some embodiments, the semiconductor structure may further include a glue layer disposed between the upper portion and the lower portion as well as between the upper portion and the source/drain contact. In some embodiments, the upper portion includes an inner layer and an outer layer and the inner layer is spaced apart from the glue layer by the outer layer.

In yet another of the embodiments, a method is provided. The method includes providing a workpiece that includes a gate structure and a source/drain contact over an active region, a selectivity metal layer over the gate structure, and a self-aligned capping (SAC) layer over the selectivity metal layer, depositing an etch stop layer (ESL) and a dielectric layer over the SAC layer, forming a gate contact opening through the dielectric layer, the ESL, and the SAC layer to expose the selectivity metal layer, depositing a first metal fill layer over the gate contact opening, etching back the first metal fill layer, after the etching back, forming a source/drain contact via opening through the dielectric layer and the ESL to expose the source/drain contact, depositing a second metal fill layer over the first metal fill layer and the source/drain contact via opening, and after the depositing of the second metal fill layer, planarizing the workpiece.

In some embodiments, the method may include before depositing the first metal fill layer, depositing a first glue layer over the gate contact opening. In some implementations, the method may further include before depositing the second metal fill layer, depositing a second glue layer over the first metal fill layer and the source/drain contact via opening. In some instances, the etching back includes use of a fluorine-containing gas, chlorine, hydrogen, oxygen, nitrous oxide, or nitrogen. In some embodiments, the etching back includes a bias between about 100 volts and about 800 volts and a temperature between about 20° C. and about 90° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an active region over a substrate;
a gate structure disposed over the active region;
a first gate spacer and a second gate spacer sandwiching the gate structure along a direction;
a metal layer over the gate structure;
a dielectric capping layer over the metal layer and top surfaces of the first gate spacer and the second gate spacer, a bottom portion of the dielectric capping layer extending between the first gate spacer and the second gate spacer along the direction and a top portion being disposed over and continuous with the bottom portion, a bottom surface of the top portion of the dielectric capping layer interfacing the top surfaces of the first gate spacer and the second gate spacer;
a source/drain contact extending along a sidewall of the first gate spacer;
an etch stop layer (ESL) disposed directly on the dielectric capping layer and the source/drain contact;
a dielectric layer disposed directly on the ESL; and
a gate contact comprising:
a lower portion extending through the dielectric capping layer to contact the metal layer, and
an upper portion disposed directly on a top surface of the lower portion,
wherein a portion of the lower portion extends directly between the first gate spacer and the second gate spacer along the direction,
wherein an interface is disposed between the lower portion and the upper portion,
wherein the top portion of the dielectric capping layer interfaces a sidewall of the source/drain contact,
wherein the top surface of the lower portion is below a bottom surface of the ESL,
wherein top surfaces of the dielectric layer and the upper portion of the gate contact are coplanar.

2. The semiconductor structure of claim 1, further comprising a first glue layer disposed between the lower portion and the metal layer.

3. The semiconductor structure of claim 1, further comprising a second glue layer extending continuously along sidewalls and a bottom surface of the upper portion, wherein a portion of the second glue layer is disposed between the lower portion and the upper portion.

4. The semiconductor structure of claim 3, further comprising:
a middle metal fill layer disposed between the second glue layer and the upper portion, wherein the middle metal fill layer comprises tungsten (W), ruthenium (Ru), aluminum (Al), molybdenum (Mo), titanium (Ti), cobalt (Co), copper (Cu), or a combination thereof.

5. The semiconductor structure of claim 3, wherein the second glue layer comprises cobalt (Co), tungsten (W), molybdenum (Mo), titanium (Ti), titanium nitride (TiN), tantalum nitride (TaN), or a combination thereof.

6. The semiconductor structure of claim 1, wherein the lower portion and the upper portion comprise tungsten (W), ruthenium (Ru), aluminum (Al), molybdenum (Mo), titanium (Ti), cobalt (Co), copper (Cu), or a combination thereof.

7. The semiconductor structure of claim 1,
wherein the lower portion terminates on the metal layer,
wherein the metal layer is in direct contact with sidewalls of the first gate spacer and the second gate spacer.

8. The semiconductor structure of claim 7, wherein the metal layer comprises tungsten (W), cobalt (Co), ruthenium (Ru), or titanium nitride (TiN).

9. The semiconductor structure of claim 7, top surfaces of source/drain contact and the dielectric capping layer are coplanar.

10. The semiconductor structure of claim 7, wherein the dielectric capping layer comprises lanthanum oxide, aluminum oxide, yttrium oxide, tantalum carbonitride, zirconium silicide, silicon oxycarbonitride, silicon oxycarbide, silicon carbonitride, zirconium nitride, zirconium aluminum oxide, titanium oxide, tantalum oxide, zirconium oxide, hafnium oxide, silicon nitride, hafnium silicide, aluminum oxynitride, silicon oxide, silicon carbide, or zinc oxide.

11. A semiconductor structure, comprising:
an active region over a substrate;
a gate structure disposed over a channel region of the active region;
a first gate spacer and a second gate spacer sandwiching the gate structure along a direction;
a source/drain contact disposed over a source/drain region of the active region;
a metal layer on the gate structure and disposed between the first gate spacer and the second gate spacer along the direction;
a dielectric capping layer over the metal layer and top surfaces of the first gate spacer and the second gate spacer, a bottom portion of the dielectric capping layer extending between the first gate spacer and the second gate spacer along the direction and a top portion of the dielectric capping layer interfacing a sidewall of the source/drain contact, the bottom portion being continuous with the top portion;
an etch stop layer (ESL) disposed on and interfacing the top surfaces of the dielectric capping layer and the source/drain contact;
a dielectric layer disposed directly on a top surface of the ESL; and
a gate contact comprising:
a lower portion extending through the dielectric capping layer to contact the metal layer, and
an upper portion spanning from a top surface of the lower portion to the top surface of the source/drain contact to physically contact the top surfaces of the lower portion and the source/drain contact; and
a glue layer continuously extending along sidewalls and a bottom surface of the upper portion,
wherein the top surface of the dielectric capping layer and the top surface of the source/drain contact are coplanar,
wherein an interface exists between the lower portion and the upper portion,
wherein top surfaces of the dielectric layer and the upper portion of the gate contact are coplanar,
wherein the glue layer is in direct contact with the dielectric capping layer.

12. The semiconductor structure of claim 11, wherein the ESL comprises silicon nitride and the dielectric layer comprises silicon oxide.

13. The semiconductor structure of claim 11, wherein the lower portion also extends through the ESL.

14. The semiconductor structure of claim 11,
wherein the sidewalls of the upper portion is spaced apart from the dielectric layer and the ESL by the glue layer,
wherein a portion of the glue layer is disposed between a bottom surface of the upper portion and a top surface of the source/drain contact.

15. The semiconductor structure of claim 14,
wherein the upper portion comprises an inner layer and an outer layer,
wherein the inner layer is spaced apart from the glue layer by the outer layer.

16. A semiconductor structure, comprising:
an active region extending lengthwise along a direction over a substrate and comprising a channel region and a source/drain region;
a gate structure disposed over the channel region of the active region;
a source/drain contact disposed over the source/drain region of the active region;
a metal layer disposed on the gate structure;
a first gate spacer and a second gate spacer sandwiching and in direct contact with the gate structure and sidewalls of the metal layer;
a dielectric capping layer disposed over the metal layer, a top surface of the first gate spacer and a top surface of the second gate spacer, a bottom portion of the dielectric capping layer extending between the first gate spacer and the second gate spacer along the direction and a top portion of the dielectric capping layer interfacing a sidewall of the source/drain contact, the bottom portion being continuous with the top portion;
an etch stop layer (ESL) disposed directly on and interfacing top surfaces of the dielectric capping layer and the source/drain contact;
a dielectric layer disposed directly on a top surface of the ESL; and
a gate contact extending through the dielectric capping layer, the ESL, and dielectric layer to electrically couple to the gate structure, the gate contact comprising:
a lower portion extending through the dielectric capping layer to contact the metal layer, and
an upper portion disposed directly on a top surface of the lower portion and extending through the dielectric layer and the ESL,
wherein the lower portion comprises a first glue layer in directly contact with the metal layer and a first metal fill layer,
wherein the first metal fill layer is spaced apart from the dielectric capping layer by the first glue layer,
wherein the upper portion comprises a second glue layer, a middle metal fill layer interfacing the second glue layer, and second metal fill layer interfacing the middle metal fill, a sidewall of the middle metal fill layer is spaced apart from the ESL and the dielectric layer by the second glue layer, and a sidewall of the second metal fill layer is spaced apart from the second glue layer by the middle metal fill layer,
wherein a portion of the dielectric capping layer extends between the first gate spacer and the second gate spacer,
wherein at least a portion of the lower portion of the gate contact is disposed between the first gate spacer and the second gate spacer,
wherein the top surfaces of the dielectric capping layer and the source/drain contact are coplanar,
wherein top surfaces of the dielectric layer and the upper portion of the gate contact are coplanar.

17. The semiconductor structure of claim 16, wherein the first glue layer and the second glue layer comprise cobalt (Co), tungsten (W), molybdenum (Mo), titanium (Ti), titanium nitride (TiN), tantalum nitride (TaN), or a combination thereof.

18. The semiconductor structure of claim 16, wherein the middle metal fill layer comprises tungsten (W), ruthenium (Ru), aluminum (Al), molybdenum (Mo), titanium (Ti), cobalt (Co), copper (Cu), or a combination thereof.

19. The semiconductor structure of claim 16,
wherein the dielectric capping layer is spaced apart from the gate structure by the metal layer,
wherein the gate contact is electrically coupled to the gate structure by way of the metal layer,
wherein the dielectric capping layer is in contact with a top surface of the metal layer.

20. The semiconductor structure of claim 19, wherein the metal layer comprises tungsten (W), cobalt (Co), ruthenium (Ru), or titanium nitride (TiN).

* * * * *